(12) United States Patent
Murata

(10) Patent No.: US 8,203,887 B2
(45) Date of Patent: Jun. 19, 2012

(54) NONVOLATILE SEMICONDUCTOR STORAGE DEVICE

(75) Inventor: Nobukazu Murata, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 197 days.

(21) Appl. No.: 12/821,403

(22) Filed: Jun. 23, 2010

(65) Prior Publication Data

US 2010/0329025 A1    Dec. 30, 2010

(30) Foreign Application Priority Data

Jun. 30, 2009 (JP) ................................. 2009-155120

(51) Int. Cl.
*G11C 11/34* (2006.01)
*G11C 16/06* (2006.01)
(52) U.S. Cl. ................................. 365/185.21; 365/185.2
(58) Field of Classification Search ............. 365/185.21, 365/185.2, 185.18
See application file for complete search history.

(56) References Cited

U.S. PATENT DOCUMENTS

| 5,910,914 A * | 6/1999 | Wang ................... 365/185.21 |
| 7,352,637 B2 * | 4/2008 | Honda ................... 365/189.09 |
| 2002/0057597 A1 * | 5/2002 | Fuchigami et al. ...... 365/185.21 |

FOREIGN PATENT DOCUMENTS

JP  2006134536 A  5/2006

* cited by examiner

*Primary Examiner* — Anh Phung
(74) *Attorney, Agent, or Firm* — Volentine & Whitt, PLLC

(57) ABSTRACT

The present invention provides a readout circuit including: a memory cell array that includes a readout target memory cell that is a data readout target; a reference memory cell having the same configuration as this memory cell; a first constant current source and a second constant current source which have the same characteristics; and a reference current source that generates, as a reference current for determining the logic level of the readout target memory cell, a current obtained by adding one constant current, out of a first constant current flowing through the first constant current source or a second constant current flowing through the second constant current source, with a reference memory cell current flowing in the reference memory cell, and by subtracting the other constant current, out of the first constant current or the second constant current, from the added current.

8 Claims, 28 Drawing Sheets

FIG. 17A
FIG. 17B
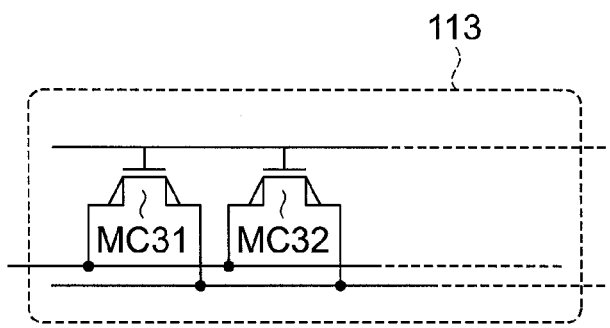
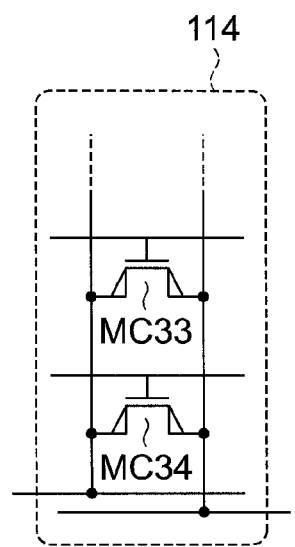

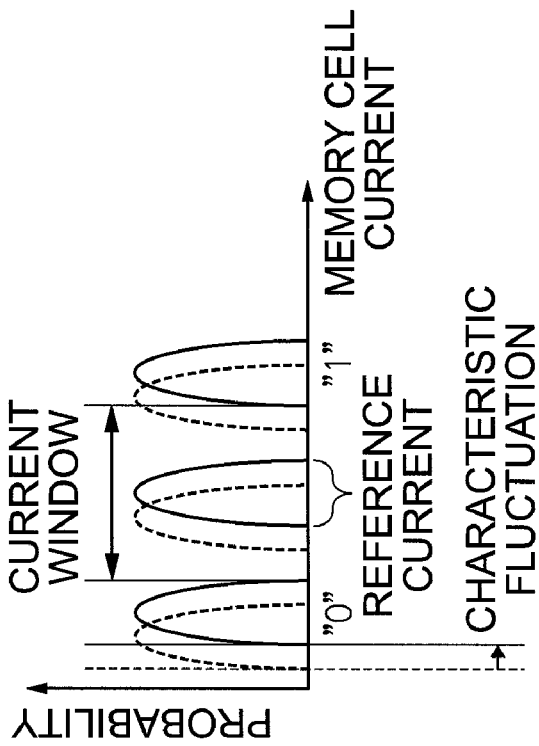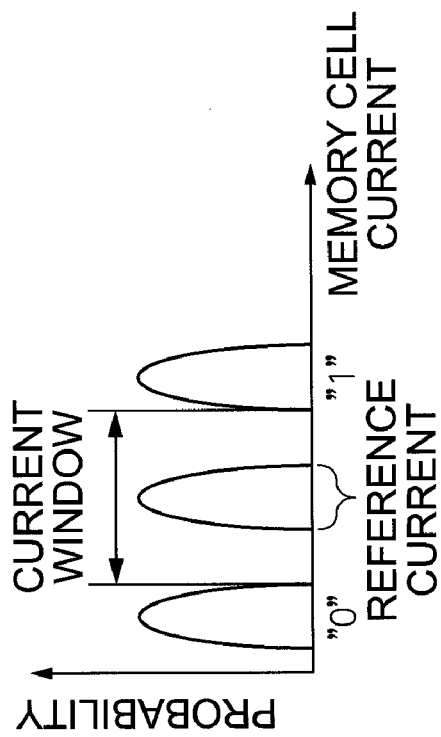

NONVOLATILE SEMICONDUCTOR STORAGE DEVICE

CROSS-REFERENCE TO RELATED APPLICATION

This application claims priority under 35 USC 119 from Japanese Patent Application No. 2009-155120, filed on Jun. 30, 2009, the disclosure of which is incorporated by reference herein.

BACKGROUND OF THE INVENTION

1. Field of the Invention

The present invention relates to a nonvolatile semiconductor storage device.

2. Description of the Related Art

As a representative of nonvolatile semiconductor storage devices, there is flash memory. Data readout of a nonvolatile semiconductor storage device is performed by comparing a memory cell current of a memory cell that becomes a readout target with a reference current, and determining the logic level of the data that have been read out. For example, in a binary memory cell, when the memory cell current is smaller than the reference current, the logic level becomes "0". On the other hand, when the memory cell current is larger than the reference current, the logic level becomes "1".

A memory cell current of logic levels "0" and "1" is distributed having variation to a certain extent, because of variation in the characteristics of the memory cell. Consequently, a conventional nonvolatile semiconductor storage device sets the reference current near, for example, the center of a region (hereinafter called a current window) with which the distribution of the memory cell current of logic levels "0" and "1" does not overlap and determines the logic level.

FIG. 26A shows a distribution of a memory cell current of logic levels, a current window, and a reference current set in the center of the current window.

Conventionally, this reference current is generated using a reference memory cell or a constant current source. When the reference memory cell is used, the average value of the memory cell current of logic levels can be used as the reference current. Further, the average value of a memory cell current adjusted to a reference current at the time of writing, and a memory cell current adjusted to a reference current at the time of erasure can be used as the reference current.

When a constant current source is used as the method of generating the reference current, a constant current source adjusted near, for example, the center of the current window can be used.

In Japanese Patent Application Laid-Open (JP-A) No. 2006-134536, there is disclosed a readout circuit that compares the reference current with a memory cell current. This circuit combines or appropriately selects a memory cell current set to a minimum value of the memory cell current after erasure, and a memory cell current set to a maximum value of the memory cell current after writing.

In recent years, current windows are becoming smaller because of miniaturization and value multiplexing of memory cells. For this reason, the importance of reference current characteristics and precision is growing.

When the reference memory cell is used to generate the reference current, like a normal memory cell that becomes a readout target, the memory cell current is adjusted by writing control. Consequently, characteristic fluctuation of the reference memory cell resulting from use conditions, such as a bias voltage and temperature, matches with a normal memory cell. However, the reference current also ends up varying just as a normal memory cell current varies.

FIG. 27A shows how the reference current varies, when the reference memory cell is used. Further, FIG. 27B shows how the reference current moves as the distribution of the memory cell current of logic levels "0" and "1" moves because of characteristic fluctuation.

On the other hand, when a constant current source is used for the reference current, the current value can be adjusted with high precision. However, in this case, characteristic fluctuation resulting from use conditions, such as a bias voltage and temperature, does not match with a memory cell. For this reason, the reference current ends up being away from the center of the current window because of use conditions, and the readout margin ends up worsening.

FIG. 28A shows how the reference current can be set with high precision, when a constant current source is used. Further, FIG. 28B shows how, as the distribution of a memory cell current of logic levels "0" and "1" moves because of characteristic fluctuation, movement resulting from characteristic fluctuation of a reference current does not match, and the readout margin worsens. FIG. 28B shows how the readout margin of logic level "0" worsens. When characteristic fluctuation is in the opposite direction, the readout margin of logic level "1" worsens.

As mentioned above, the circuit described in JP-A No. 2006-134536 combines or appropriately selects a memory cell current set to a minimum value of the memory cell current after erasure, and a memory cell current set to a maximum value of the memory cell current after writing. However, this circuit cannot move the reference current with high precision to the center of the current window, in response to characteristic fluctuation of the memory cell.

SUMMARY OF THE INVENTION

The present invention provides a nonvolatile semiconductor storage device that can generate a reference current having both characteristic fluctuation matching a memory cell, and the precision of a constant current source.

A first aspect of the present invention is a nonvolatile semiconductor storage device including: a readout target memory cell that is a data readout target; a reference memory cell having the same configuration as the readout target memory cell; a constant current source that includes a first constant current source and a second constant current source, which have the same characteristics; and a reference current source that generates, as a reference current for determining the logic level of the readout target memory cell, a current obtained by adding one constant current, out of a first constant current flowing through the first constant current source or a second constant current flowing through the second constant current source, with a reference memory cell current flowing in the reference memory cell, and by subtracting the other constant current, out of the first constant current or the second constant current, from the added current.

A second aspect of the present invention, in the above aspect, the reference current source may include, a first current mirror circuit connected with, a first MOS transistor through which the one constant current flows, and a second MOS transistor, through which the other constant current flows, that passes the same current as the current in through the first MOS transistor, and a second current mirror circuit connected with, a third MOS transistor through which the reference memory cell current flows, and a fourth MOS transistor that passes the same current as the current flowing in the third MOS transistor, wherein at least one of the third MOS transistor and the fourth MOS transistor may be connected to the second MOS transistor.

A third aspect of the present invention, in the above aspects, the nonvolatile semiconductor storage device may include plural reference memory cells having the same configuration, and the reference memory cell current may be a current obtained by averaging a plurality of reference memory cell currents flowing through the plurality of the reference memory cells.

A fourth aspect of the present invention, in the above aspects, the nonvolatile semiconductor storage device may include, plural reference memory cells through which plural types of the reference memory cell currents respectively flow, plural constant current sources through which plural types of the two constant currents respectively flow, and plural reference current sources that generate plural types of the reference currents.

A fifth aspect of the present invention, in the above aspect, the nonvolatile semiconductor storage device may include, plural constant current sources through which plural types of the two constant currents respectively flow, plural reference current sources that generate plural types of the reference currents, and a cell current mirror circuit, disposed between the plurality of the reference current sources and the reference memory cell, that generates plural types of reference memory cell currents from the reference memory cell current flowing through the reference memory cell.

A sixth aspect of the present invention, in the above aspects, the first constant current source, included in at least one constant current source of the plurality of the constant current sources, may be also dually used as the first constant current source included in at least one constant current source of another, and the dually-used first constant current source may include, a constant current generating section that generates plural types of the first constant current.

A seventh aspect of the present invention, in the above aspects, the reference current source may include a reference current generating section that generates a different reference current from the reference current that has been generated.

An eighth aspect of the present invention, in the above aspects, may further include, a comparing section that outputs a result of comparison between a memory cell current of the readout target memory cell, and the reference current that has been generated by the reference current source.

According to the aspects of the present invention, a reference current having both characteristic fluctuation matching a memory cell, and the precision of a constant current source can be generated.

BRIEF DESCRIPTION OF THE DRAWINGS

Exemplary embodiments of the present invention will be described in detail based on the following figures, wherein:

FIG. 17A and FIG. 17B are circuit diagrams of reference memory cell array according to a fifth exemplary embodiment;

FIG. 27A and FIG. 27B are diagrams showing the relationship between a memory cell current and a reference current.

DETAILED DESCRIPTION OF THE INVENTION

Exemplary embodiments of the present invention will be described in detail below with reference to the drawings.

First Exemplary Embodiment

Figure 1:
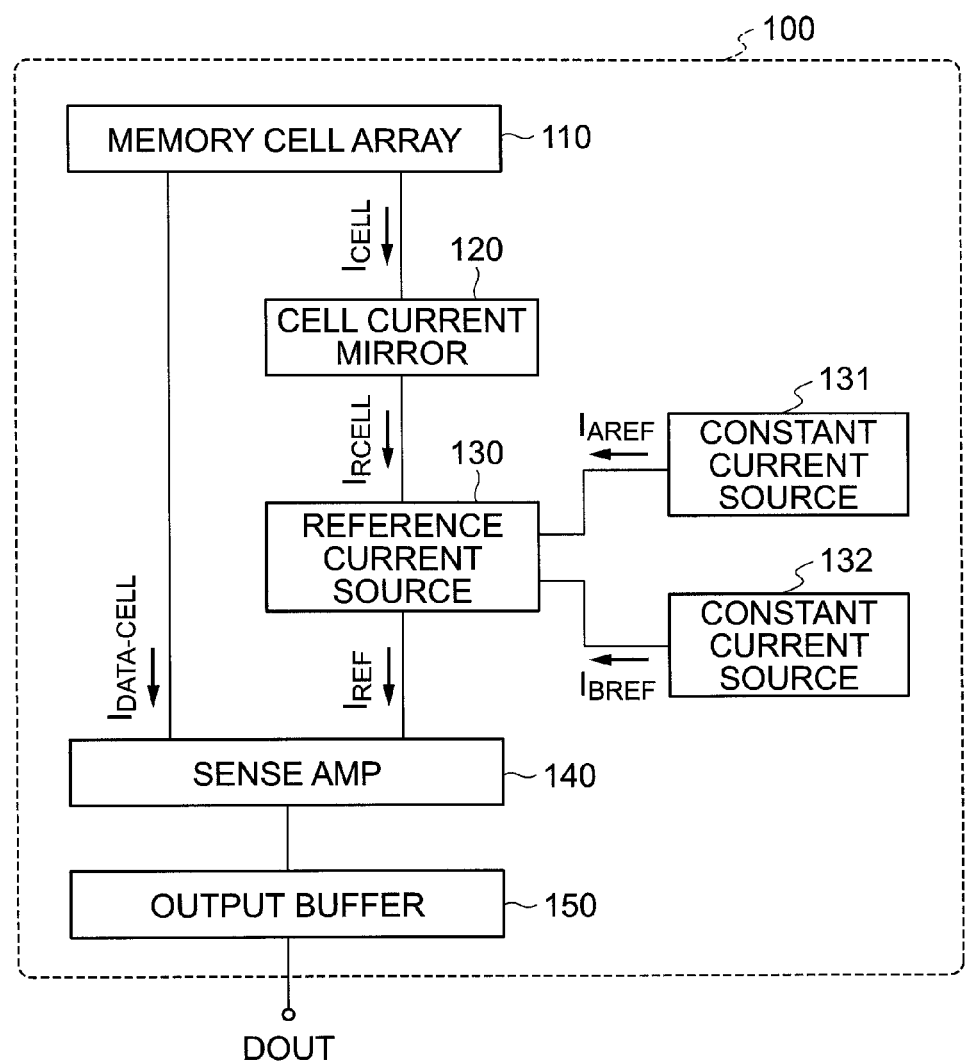
FIG. 1 is a block diagram of a readout circuit according to a first exemplary embodiment.

FIG. 1 is a block diagram showing the configuration of a readout circuit 100 according to a first exemplary embodiment of the present invention. As shown in FIG. 1, the readout circuit 100 is configured including, a memory cell array 110, a cell current mirror 120, a reference current source 130, constant current sources 131 and 132, a sense amp 140, and an output buffer 150.

Figure 2:
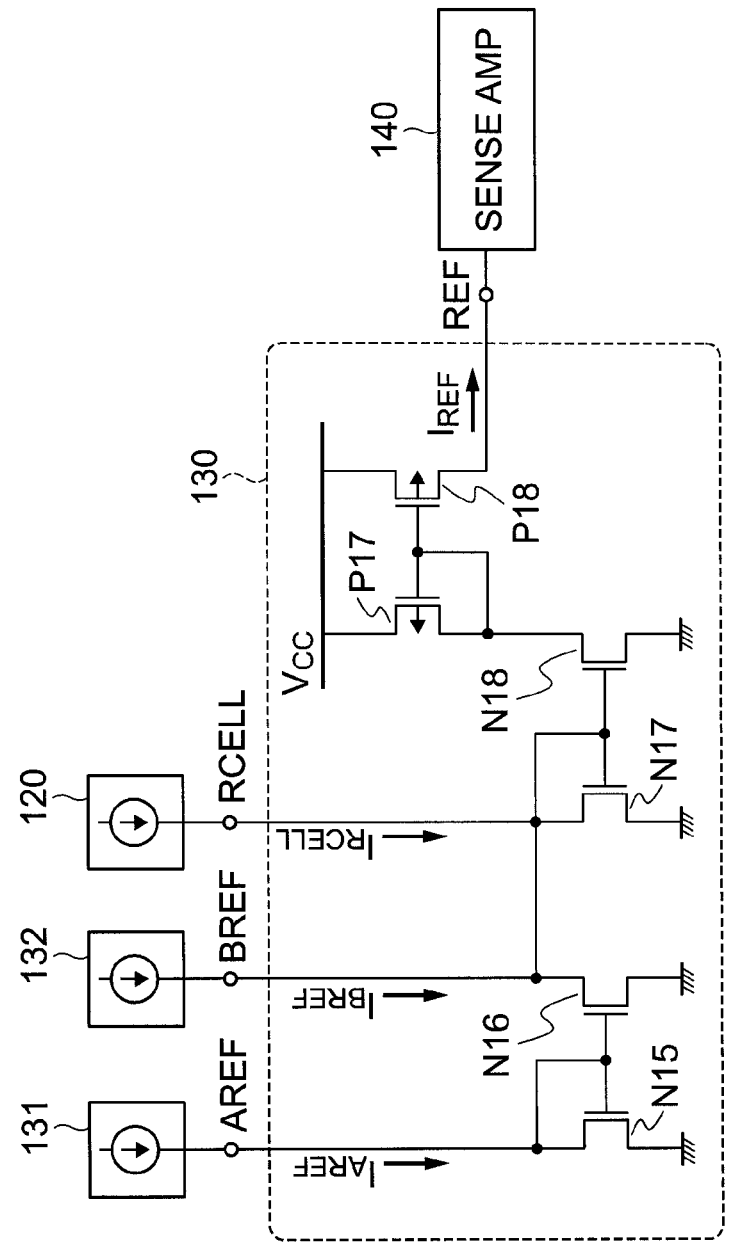
FIG. 2 is a circuit diagram of a reference current source according to the first exemplary embodiment.

FIG. 2 is a circuit diagram of the reference current source 130. Here, transistors prefixed with "P" are PMOS transistors. Further, transistors prefixed with "N" are NMOS transistors. Further, transistors prefixed with "MC" are memory cells. Further, elements prefixed with "OP" are differential amplifier circuits. Further, elements prefixed with "R" are resistors.

The drain terminal of N15 is connected to a REF terminal of the constant current source 131 via an AREF terminal. Further, the gate terminal of N15 is connected to the drain terminal, and the source terminal of N15 is grounded.

The drain terminal of N16 is connected to a REF terminal of the constant current source 132 via a BREF terminal. The drain terminal of N16 is also connected to an RCELL terminal of the cell current mirror 120 via an RCELL terminal. Further, the gate terminal of N16 is connected to the gate terminal of N15, and the source terminal of N16 is grounded. N15 and N16 form a current mirror circuit, and are configured by transistors of the same size.

The drain terminal of N17 is, like the drain terminal of N16, connected to the constant current source 132 and the cell current mirror 120. Further, the gate terminal of N17 is connected to the drain terminal, and the source terminal of N17 is grounded.

The drain terminal of N18 is connected to the drain terminal of P17. Further, the gate terminal of N18 is connected to the gate terminal of N17, and the source terminal of N18 is grounded. N17 and N18 form a current mirror circuit, and are configured by transistors of the same size.

The drain terminal of P17 is connected to the drain terminal of N18. Further, the gate terminal of P17 is connected to the drain terminal, and the source terminal of P17 is connected to a VCC power supply.

The drain terminal of P18 is connected to the sense amp 140 via a REF terminal. Further, the gate terminal of P18 is connected to the gate terminal of P17, and the source terminal of P18 is connected to the VCC power supply. P17 and P18 form a current mirror circuit, and are configured by transistors of the same size.

Figure 3:
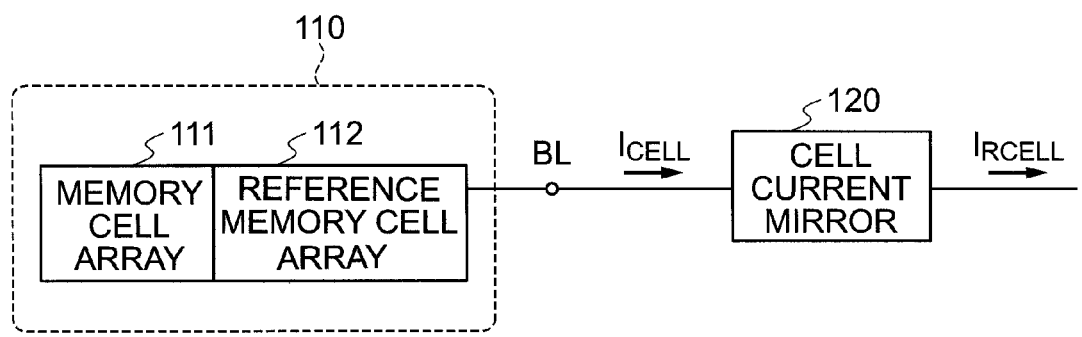
FIG. 3 is a block diagram of a memory cell array according to the first exemplary embodiment.

FIG. 3 is a block diagram showing the general configuration of the memory cell array 110. The memory cell array 110 is configured to include a memory cell array 111 and a reference memory cell array 112. For each memory cell in the memory cell array 111 and each memory cell in the reference memory cell array 112, for example, memory cells of the same configuration (that is, having the same characteristics) are used.

Figure 4:
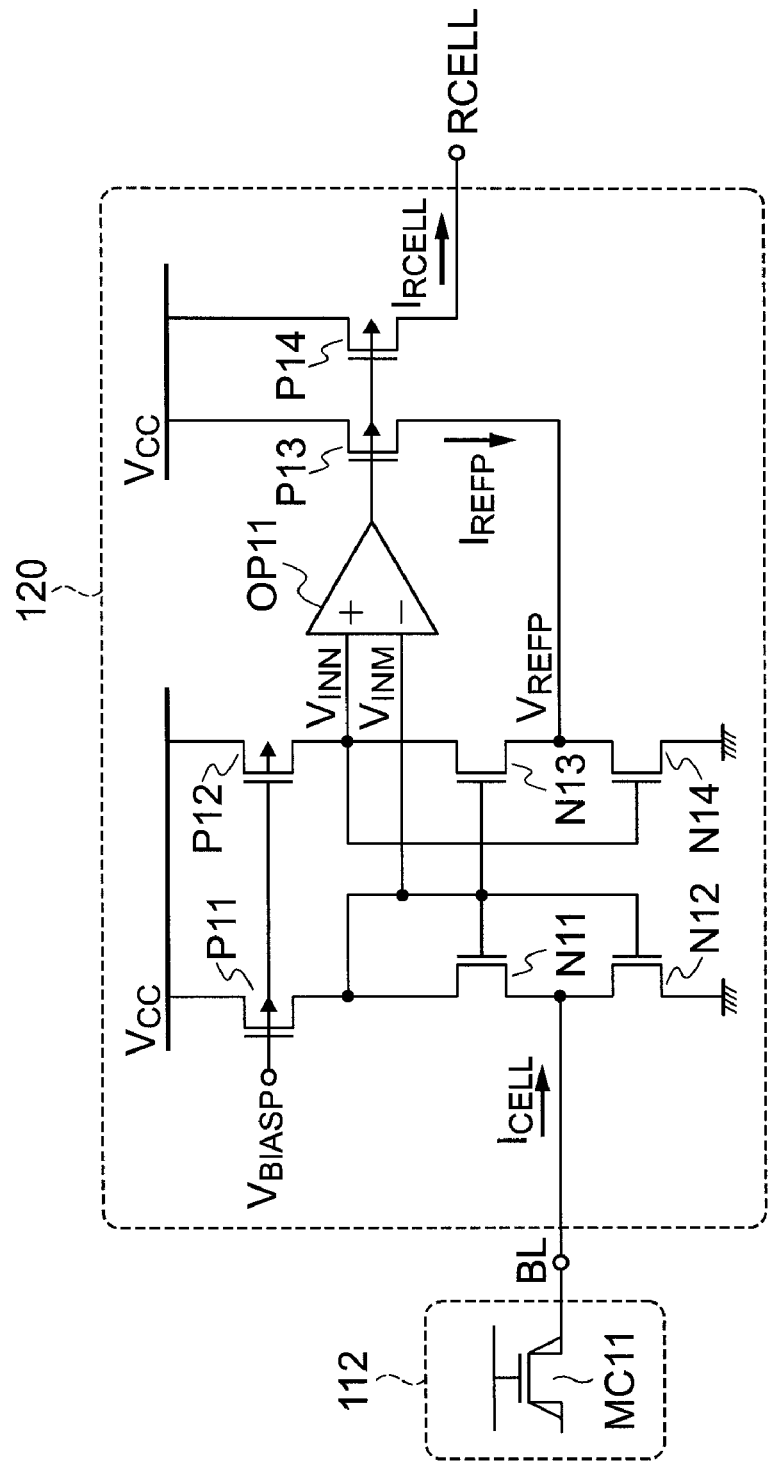
FIG. 4 is a circuit diagram of a cell current mirror according to the first exemplary embodiment.

FIG. 4 is one example of a circuit configured by the reference memory cell array 112 and the cell current mirror 120. The reference memory cell array 112 is shown with only one reference memory cell MC11.

The drain terminal and the gate terminal of MC11 included in the reference memory cell array 112 are, like other memory cells (not shown) that become readout targets in the memory cell array 111, connected to a voltage source to which a predetermined voltage is supplied.

The gate terminals of P11 and P12 of the cell current mirror 120 are connected to a VBIASP power supply, and the source terminals of P11 and P12 are connected to a VCC power supply. Further, the drain terminal of P11 is connected to a VINM node, and the drain terminal of P12 is connected to a VINN node.

The drain terminal and the gate terminal of N11 are connected to the VINM node. Further, the source terminal of N11 is connected to the drain terminal of N12. The source terminal of N11 is also connected to the source terminal of MC11 via a BL terminal.

The drain terminal of N12 is connected to the source terminal of N11. The drain terminal of N12 is also connected to the source terminal of MC11 via the BL terminal. Further, the gate terminal of N12 is connected to the VINM node, and the source terminal of N12 is grounded.

The drain terminal of N13 is connected to the VINN node, and the gate terminal of N13 is connected to the VINM node. Further, the source terminal of N13 is connected to the drain terminal of N14. The source terminal of N13 is also connected to the drain terminal of P13 via a VREFP node.

The drain terminal of N14 is connected to the source terminal of N13. The drain terminal of N14 is also connected to the drain terminal of P13 via the VREFP node. Further, the gate terminal of N14 is connected to the VINN node, and the source terminal of N14 is grounded.

The + terminal of OP11 is connected to the VINN node, and the − terminal of OP11 is connected to the VINM node. Further, the output terminal of OP11 is connected to the gate terminals of P13 and P14.

The gate terminals of P13 and P14 are connected to the output terminal of OP11, and the source terminals of P13 and P14 are connected to a VCC power supply. Further, the drain terminal of P13 is connected to the VREFP node, and the drain terminal of P14 is connected to the RCELL terminal.

Figure 5:
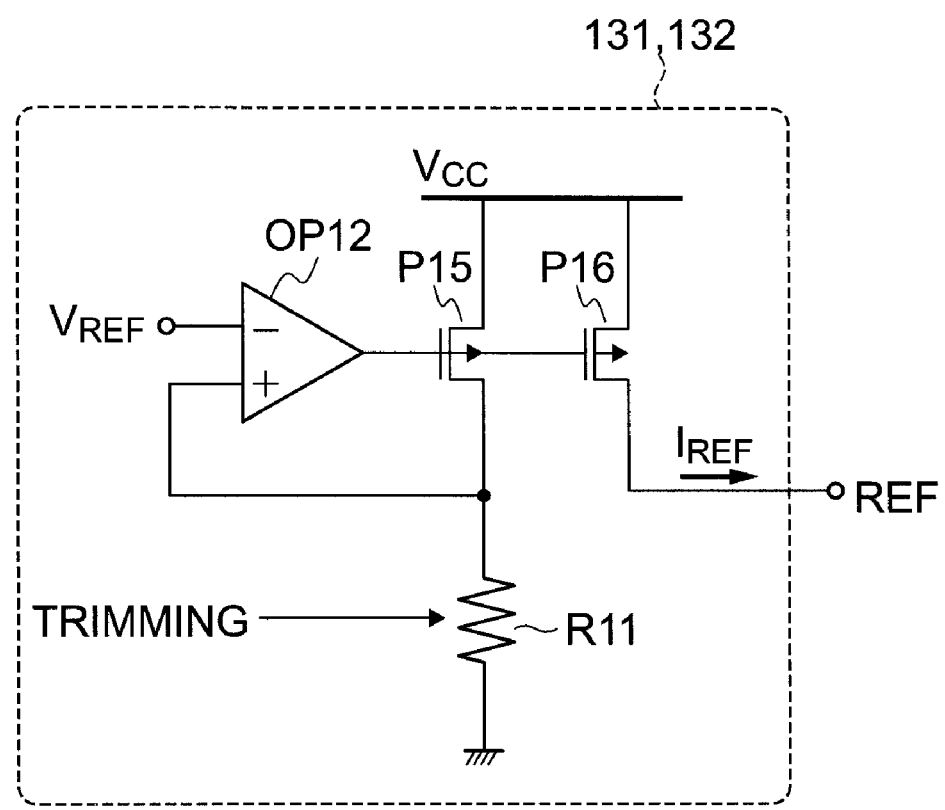
FIG. 5 is a circuit diagram of a constant current source according to the first exemplary embodiment.

FIG. 5 is one example of a circuit that realizes the constant current sources 131 and 132. The − terminal of OP12 is connected to a VREF power supply. Here, the VREF power supply is a constant voltage source that supplies a predetermined constant voltage. The + terminal of OP12 is connected to the drain terminal of P15. The + terminal of OP12 is grounded via R11. Further, the output terminal of OP12 is connected to the gate terminals of P15 and P16.

The source terminals of P15 and P16 are connected to a VCC power supply, and the gate terminals of P15 and P16 are connected to the output terminal of OP12. Further, the drain terminal of P15 is connected to the + terminal of OP12. The drain terminal of P15 is also grounded via R11. The drain terminal of P16 is connected to the REF terminal. P15 and P16 form a current mirror circuit.

Next, the operation of the readout circuit 100 will be described as the operation of the present exemplary embodiment. As shown in FIG. 1, here, IDATA-CELL denotes a current flowing from the memory cell array 110 into the sense amp 140. IDATA-CELL denotes a memory cell current of a memory cell that becomes a readout target.

Further, ICELL denotes a memory cell current flowing from the memory cell array 110 into the BL terminal of the cell current mirror 120. IRCELL denotes a current flowing from the cell current mirror 120 via the RCELL terminal into the reference current source 130. IAREF and IBREF respectively denote currents flowing from the constant current sources 131 and 132 via the REF terminals into the AREF terminal and the BREF terminal of the reference current source 130. IREF denotes a current flowing from the reference current source 130 via the REF terminal into the sense amp 140. The reference current source 130 generates IREF from IRCELL, IAREF and IBREF. IREF is used by the sense amp 140 as a reference current.

The sense amp 140 is a current sink type. The sense amp 140 compares IREF to inflowing IDATA-CELL and determines the logic level "0" or "1" of data to be read out. The determination result of the sense amp 140 is outputted as an output signal DOUT via the output buffer 150.

Next, the operation of the reference current source 130 will be described. The currents flowing in N15 and N16 are equal because of the current mirror circuit formed by N15 and N16 as shown in FIG. 2. Consequently, when IAREF denotes a current flowing in from the AREF terminal, the current flowing in N16 can also be denoted as IAREF.

When IBREF denotes a current flowing in from the BREF terminal and IRCELL denotes a current flowing in from the RCELL terminal, the sum of the currents flowing in N16 and N17 becomes IBREF+IRCELL. As mentioned above, the current flowing in N16 is IAREF, so the current flowing in N17 is IBREF+IRCELL−IAREF. Further, the currents flowing in N17 and N18 are equal because of the current mirror circuit formed by N17 and N18. Consequently, the current flowing in N18 is also IBREF+IRCELL−IAREF.

P17 and N18 are connected in series, and the currents flowing in P17 and N18 are equal. Further, the currents flowing in P17 and P18 are also equal because of the current mirror circuit formed by P17 and P18. Consequently, when IREF denotes a current flowing out from the REF terminal, the currents flowing in P17 and N18 are IREF=IBREF+IRCELL−IAREF.

Next, the operation of the circuit configured by the reference memory cell array 112 and the cell current mirror 120 will be described. As shown in FIG. 4, ICELL denotes a memory cell current flowing via the BL terminal from MC11 into N12. Further, IREFP denotes a current flowing via the VREFP node from P13 into N14. Further, the VBIASP power supply is set to an appropriate voltage value such that P11 and P12 operate in a saturated region.

First, attention will be given to P11, N11, and N12. P11 and N11 operate in a saturated region. In this case, the voltage of the BL terminal slightly increases or decreases as ICELL increases or decreases. N11 works as a gate-grounded amplifier circuit. The voltage of the VINM node increases or decreases more greatly than the voltage of the BL terminal as ICELL increases or decreases. In the present exemplary embodiment, the voltage of the BL terminal is about 0.1 [V], for example.

Next, attention will be given to P12, N13, and N14. P12 and N13 operate in a saturated region. In this case, the voltage of the VREFP node slightly increases or decreases as IREFP increases or decreases. N13 works as a gate-grounded amplifier circuit. The voltage of the VINN node increases or decreases more greatly than the voltage of the VREFP node as IREFP increases or decreases.

OP11 is an NMOS gate input, and its operating conditions are VINM>VTN and VINN>VTN. VTN is an NMOS transistor threshold voltage. For that reason, by connecting VINM and VINN respectively to the gate terminals of NMOS transistors N12 and N14, VINM>VTN and VINN>VTN are ensured. Further by connecting in this manner, there is a feedback effect from the VINM node and the VINN node to the BL terminal and the VREFP terminal, and circuit operation stabilizes.

By making the voltages of the − terminal and the + terminal of OP11 equal, the VINM node and the VINN node become the same voltage. Consequently, the operating conditions of (P11, N11, N12) and (P12, N13, N14) completely match, and ICELL=IREFP. Further, when IRCELL denotes a current flowing out from the RCELL terminal, becomes IRCELL∝IREFP because of the current mirror circuit formed by P13 and P14. Consequently, IRCELL∝ICELL.

The condition of the input voltage of the VINM node for NMOS transistor N11 to operate in a saturated region is given by the following expression.

$$VINM > VREF + VTN \quad (1)$$

Here, VREF denotes the voltage of the BL terminal.

Further, the condition of the input voltage VINM of the VINM node for NMOS transistor N12 to be ON can be given by the following expression.

$$VINM > VTN \quad (2)$$

Further, the condition of the input voltage of the VINM node for PMOS transistor P11 to operate in a saturated region can be given by the following expression.

$$VINM < VBIASP + |VTP| \quad (3)$$

In the cell current mirror 120, the drain terminal and the gate terminal of NMOS transistor N11 are shunted to ensure that expressions (1) and (2) are always satisfied. However, it is necessary to ensure that expression (3) is satisfied because the voltage of VINM also becomes high when the voltage of VREF is high because of expression (1).

In this manner, the cell current mirror 120 can exhibit a normal function as a current mirror circuit, even when ICELL flowing into the drain terminal of NMOS transistor N12 is a small current where NMOS transistor N12 operates in a linear region.

Further, because the gates of N11 and N13 are shunted, it is not necessary to supply a bias voltage V to these gates. For this reason, in the first embodiment, the circuit configuration can be simplified. Further, in the first embodiment, a more flexible circuit configuration becomes possible because limitations on the voltage condition of VREF are eased.

Next, operation of the constant current sources 131 and 132 will be described. The current flowing in P15 and R11 becomes VREF/R11, because of the operation that makes the voltages of the − terminal and the + terminal of OP12 shown in FIG. 5 equal. Further, when IREF denotes a current flowing out from the REF terminal, becomes IREF∝VREF/R11 because of the current mirror circuit formed by P15 and P16.

When this constant current source is used, IREF can be adjusted with high precision by adjusting R11 with a trimming circuit or the like.

IRCELL flowing from the cell current mirror 120 into the reference current source 130 is proportional to the memory cell current of MC11. MC11 is used in the same condition as a memory cell that becomes a readout target. For this reason, characteristic fluctuation resulting from use conditions such as a bias voltage and temperature matches the readout target memory cell. Consequently, IRCELL represents a current value in which characteristic fluctuation of the readout target memory cell is reflected. Note that, ΔIRCELL denotes change in IRCELL accompanying this characteristic fluctuation.

The characteristics of the constant current sources 131 and 132 also fluctuate because of use conditions such as a bias voltage and temperature. ΔIAREF and ΔIBREF respectively denote change in IAREF and IBREF accompanying this characteristic fluctuation. Characteristic fluctuation does not match because the circuit configuration differs from a readout target memory cell.

The current flowing out from the REF terminal of the reference current source 130 can be denoted as IREF=IBREF+IRCELL−IAREF. Consequently, change resulting from characteristic fluctuation will be ΔIREF=ΔIBREF+ΔIRCELL−ΔIAREF. Here, when IAREF and IBREF are set to current values that are about the same, ΔIAREF and ΔIBREF also become values that are about the same. Consequently, ΔIBREF+ΔIRCELL−ΔIAREF≈ΔIRCELL.

IRCELL is a mirror current of a mirror cell current. Because of this, it is distributed having variation to a certain extent because of the affect of characteristic variation of a memory cell. ΔIMC denotes deviation from a target value of IRCELL resulting from this variation. In order to cancel out ΔIMC, IBREF and IAREF can be adjusted with a trimming circuit or the like, so that IBREF−IAREF=−ΔIMC.

For example, when the target value of IRCELL (that is, the target value of IREF) is 10 [µA], it is ideal to make both IAREF and IBREF 10 [µA]. However, sometimes IRCELL deviates from the target value. Consequently, first, the resistance value of resistor R11 of the constant current source 131 is adjusted so that IAREF becomes 10 [µA]. Further, the actual IRCELL is measured, and when the measured value is 11 [µA], for example, IRCELL deviates 1 [µA] from the target value. Consequently, the resistance value of R11 of the constant current source 132 is adjusted so that IBREF becomes (10−1) [µA]=9 [µA]. Thus, IREF can be made into the target value.

From the above, in consideration of characteristic fluctuation and memory cell characteristic variation, the current flowing out from the REF terminal of the reference current source 130 is IREF=IBREF+IRCELL−IAREF+$\Delta$IBREF+$\Delta$IRCELL−$\Delta$IAREF+$\Delta$IMC. Here, $\Delta$IBREF+$\Delta$IRCELL−$\Delta$IAREF≈$\Delta$IRCELL and IBREF−IAREF=−$\Delta$IMC. Consequently, IREF≈IRCELL+$\Delta$IRCELL. Namely, a reference current having both characteristic fluctuation matching a memory cell and the precision of a constant current source can be realized because of IREF of the reference current source 130.

Figure 6A:
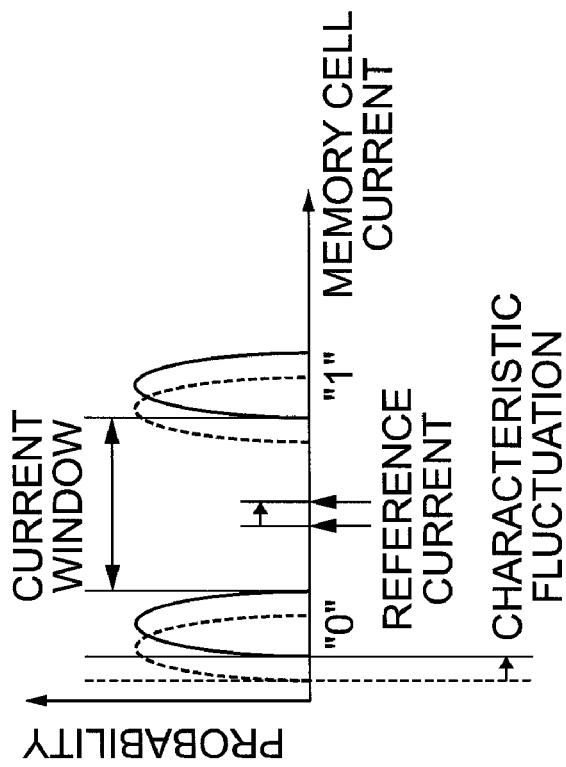
FIG. 6A and FIG. 6B are diagrams showing the relationship between a memory cell current and a reference current, according to the first exemplary embodiment.
Figure 6B:
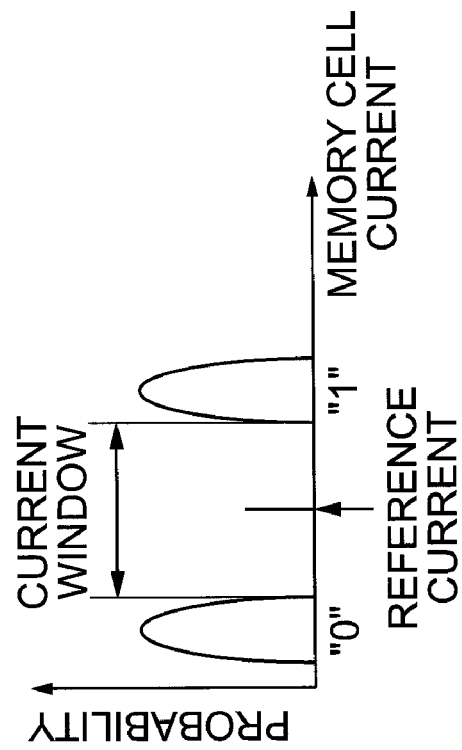

FIG. 6A shows how the reference current can be set with high precision because of IREF of the reference current source 130. As shown in FIG. 6A, it will be understood that the reference current is set in the substantial center of the current window. Further, FIG. 6B shows how the reference current also moves as the distribution of the memory cell current of logic levels "0" and "1" moves because of characteristic fluctuation. Thus, even when the distribution of the memory cell current of logic levels "0" and "1" moves, the reference current stays in the substantial center of the current window. Consequently, the readout circuit 100 according to the first exemplary embodiment of the present invention can improve the determination precision of logic levels "0" and "1".

Second Exemplary Embodiment

Next, a second exemplary embodiment of the present invention will be described. The same signs will be given to portions that are the same as those in the first exemplary embodiment, and detailed description of those same portions will be omitted.

Figure 7:
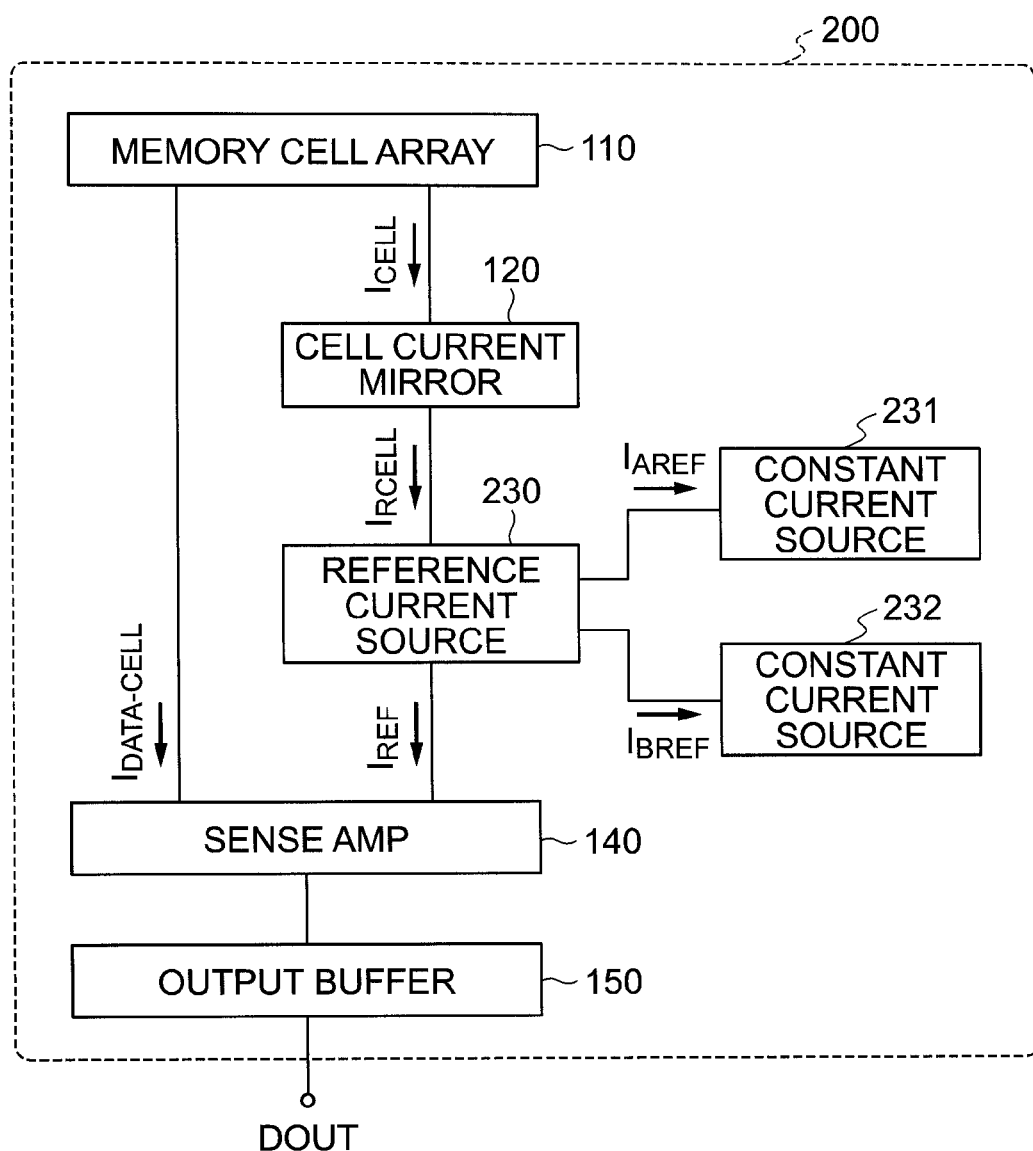
FIG. 7 is a block diagram of a readout circuit according to a second exemplary embodiment.

FIG. 7 shows a block diagram showing the general configuration of a readout circuit 200 according to the present exemplary embodiment. As shown in FIG. 7, the readout circuit 200 uses a reference current source 230 instead of the reference current source 130 of the readout circuit 100, described in the first exemplary embodiment. The readout circuit 200 also uses constant current sources 231 and 232 instead of the constant current sources 131 and 132 of the readout circuit 100.

The readout circuit 200 is configured to include a memory cell array 110, a cell current mirror 120, the reference current source 230, the constant current sources 231 and 232, a sense amp 140, and an output buffer 150.

Figure 8:
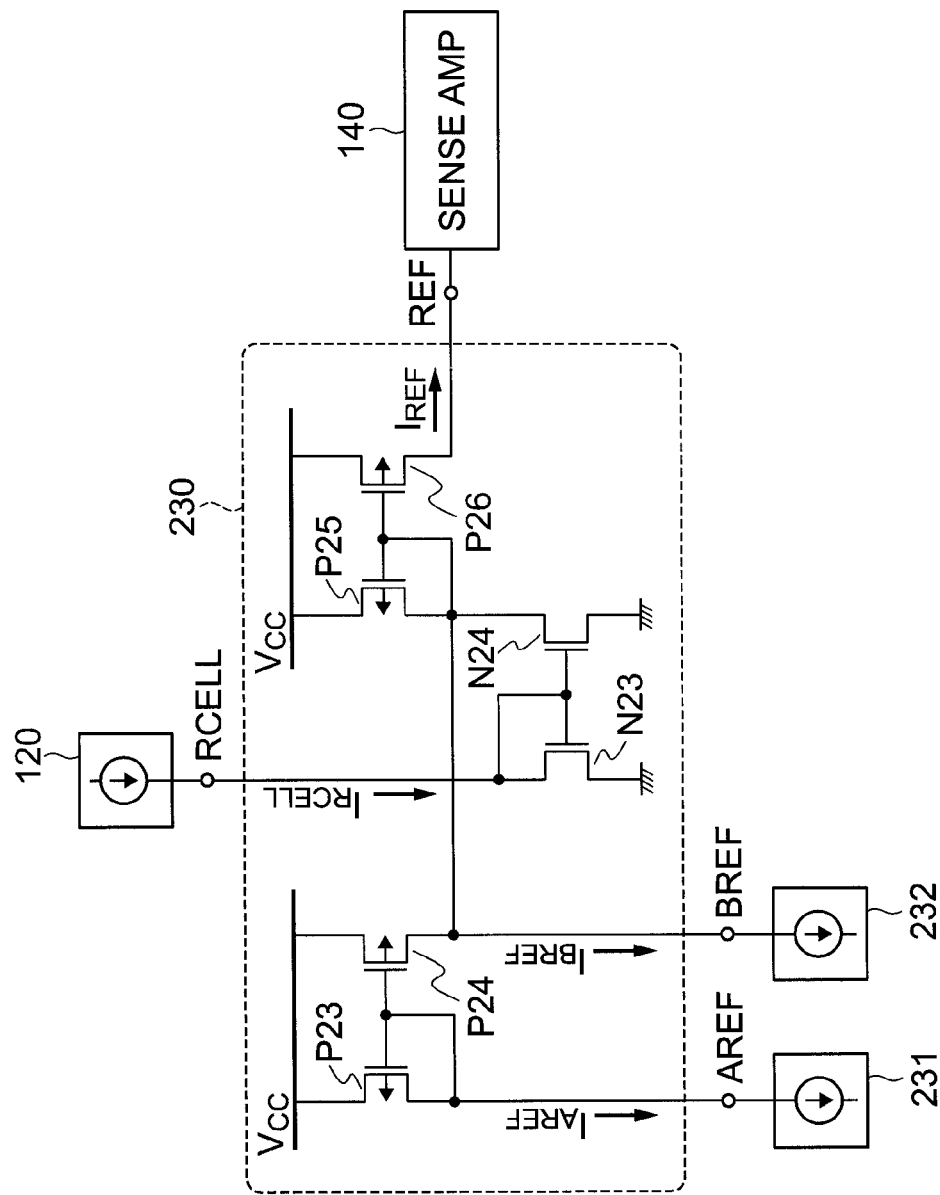
FIG. 8 is a circuit diagram of a reference current source according to the second exemplary embodiment.

FIG. 8 is a circuit diagram of the reference current source 230. The drain terminal of P23 is connected to a REF terminal of the constant current source 231 via an AREF terminal. Further, the gate terminal of P23 is connected to the drain terminal, and the source terminal of P23 is connected to a VCC power supply.

The drain terminal of P24 is connected to a REF terminal of the constant current source 232 via a BREF terminal. The drain terminal of P24 is also connected to the drain terminals of N24 and P25. Further, the gate terminal of P24 is connected to the gate terminal of P23, and the source terminal of P24 is connected to the VCC power supply. P23 and P24 form a current mirror circuit, and are configured by transistors of the same size.

The drain terminal of N23 is connected to an RCELL terminal of the cell current mirror 120 via an RCELL terminal. Further, the gate terminal of N23 is connected to the drain terminal, and the source terminal of N23 is grounded.

The drain terminal of N24 is connected to the REF terminal of the constant current source 232 via the BREF terminal. The drain terminal of N24 is also connected to the drain terminals of P24 and P25. Further, the gate terminal is N24 is connected to the gate terminal of N23, and the source terminal of N24 is grounded. N23 and N24 form a current mirror circuit, and are configured by transistors of the same size.

The drain terminal of P25 is connected to the REF terminal of the constant current source 232 via the BREF terminal. The drain terminal of P25 is also connected to the drain terminals of P24 and N24. Further, the gate terminal of P25 is connected to the drain terminal, and the source terminal of P25 is connected to a VCC power supply.

The drain terminal of P26 is connected to the sense amp 140 via a REF terminal. Further the gate terminal of P26 is connected to the gate terminal of P25, and the source terminal of P26 is connected to the VCC power supply. P25 and P26 form a current mirror circuit, and are configured by transistors of the same size.

Figure 9:
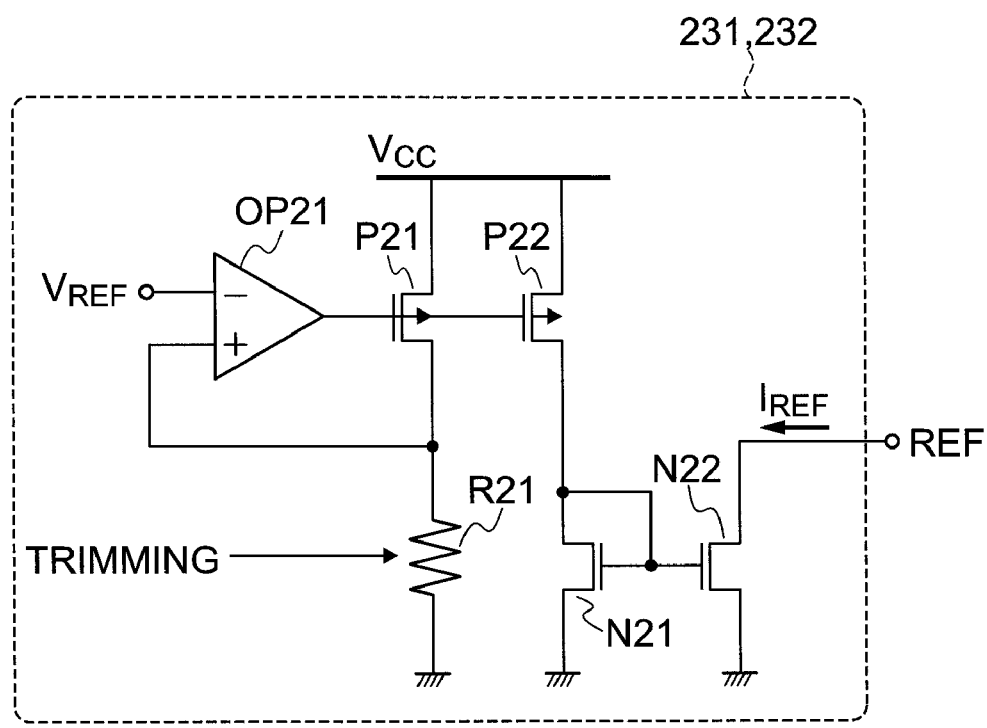
FIG. 9 is a circuit diagram of a constant current source according to the second exemplary embodiment.

FIG. 9 is one example of a circuit that realizes the constant current sources 231 and 232. The − terminal of OP21 is connected to a VREF power supply. Here, the VREF power supply is a constant voltage source that supplies a predetermined voltage. The + terminal of OP21 is connected to the drain terminal of P21. The + terminal of OP21 is also grounded via R21. Further, the output terminal of OP21 is connected to the gate terminals of P21 and P22.

The source terminals of P21 and P22 are connected to a VCC power supply, and the gate terminals of P21 and P22 are connected to the output terminal of OP21. Further, the drain terminal of P21 is connected to the + terminal of OP21. The drain terminal of P21 is also grounded via R21. The drain terminal of P22 is connected to the drain terminal of N21. P21 and P22 form a current mirror circuit.

The drain terminal of N21 is connected to the drain terminal of P22. Further, the gate terminal of N21 is connected to the drain terminal, and the source terminal of N21 is grounded.

The drain terminal of N22 is connected to a REF terminal. Further, the gate terminal of N22 is connected to the gate terminal of N21, and the source terminal of N21 is grounded. N21 and N22 form a current mirror circuit.

Other circuit configurations are the same as those of the circuits configuring the readout circuit 100, so description will be omitted.

Next, the operation of the readout circuit 200 will be described as the operation of the present exemplary embodiment. Here, IAREF and IBREF respectively denote currents flowing out from the reference current source 230 to the constant current sources 231 and 232.

First, the operation of the reference current source 230 will be described. The currents flowing in P23 and P24 are equal because of the current mirror circuit formed by P23 and P24 as shown in FIG. 8. Consequently, when IAREF denotes a current flowing out from the AREF terminal, the current flowing in P24 also becomes IAREF.

The currents flowing in N23 and N24 are equal because of the current mirror circuit formed by N23 and N24. Consequently, when IRCELL denotes a current flowing in from the RCELL terminal, the current flowing in N24 also becomes IRCELL.

When IBREF denotes a current flowing out from the BREF terminal, the sum of the currents flowing in P24 and P25 becomes IBREF+IRCELL. As mentioned above, the current flowing in P24 is IAREF, so the current flowing in P25 becomes IBREF+IRCELL−IAREF. Further, the currents flowing in P25 and P26 are equal because of the current mirror circuit formed by P25 and P26. Consequently, when IREF denotes a current flowing out from the REF terminal, IREF=IBREF+IRCELL−IAREF.

Next, the operation of the constant current sources 231 and 232 will be described. By making the voltages of the − terminal and the + terminal of OP21 shown in FIG. 9 equal, the current flowing in P21 and R21 becomes VREF/R21. Further, when IREF denotes a current flowing in from the REF terminal, IREF∝VREF/R21 because of the current mirror circuits formed by P21 and P22 and by N21 and N22.

When this constant current source is used, IREF can be adjusted with high precision by adjusting R21 with a trimming circuit or the like.

Other operations are the same as the operations of the readout circuit 100, so description will be omitted.

Description in regard to fluctuation of the reference current IREF, when ΔIAREF and ΔIBREF respectively denote change in IAREF and IBREF accompanying characteristic fluctuation of the constant current sources 231 and 232 is the same as in the first exemplary embodiment, so it will be omitted. However, the readout circuit 200 also has the same effects as those of the readout circuit 100 described in the first exemplary embodiment. Namely, because of IREF of the reference current source 230, the readout circuit 200 according to the second exemplary embodiment can also realize a reference current having both characteristic fluctuation matching a memory cell, and the precision of a constant current source.

Third Exemplary Embodiment

Next, a third exemplary embodiment will be described. The same signs will be given to portions that are the same as those in the preceding exemplary embodiments, and detailed description of those same portions will be omitted.

Figure 10:
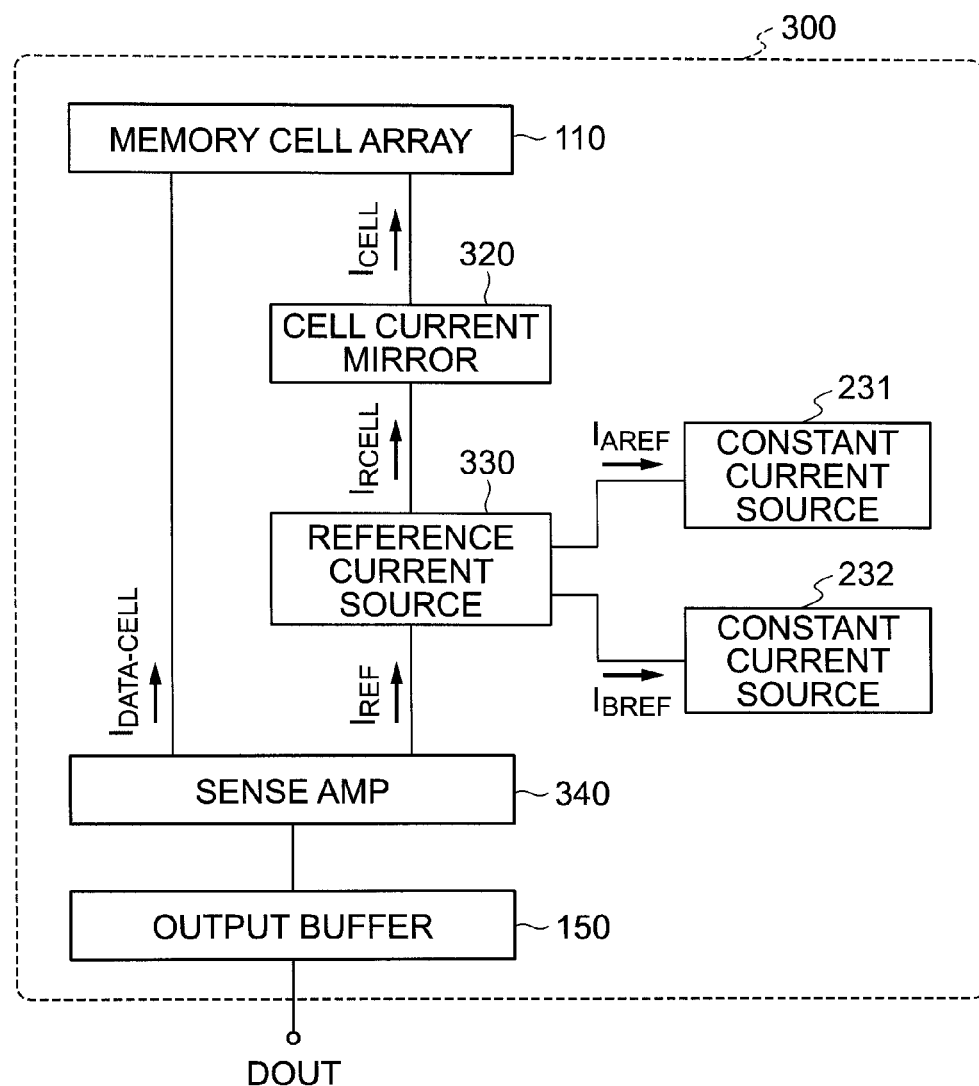
FIG. 10 is a block diagram of a readout circuit according to a third exemplary embodiment.

FIG. 10 shows a block diagram showing the general configuration of a readout circuit 300 according to the present exemplary embodiment. As shown in FIG. 10, the readout circuit 300 is configured to include a memory cell array 110, a cell current mirror 320, a reference current source 330, constant current sources 231 and 232, a sense amp 340, and an output buffer 150.

Figure 11:
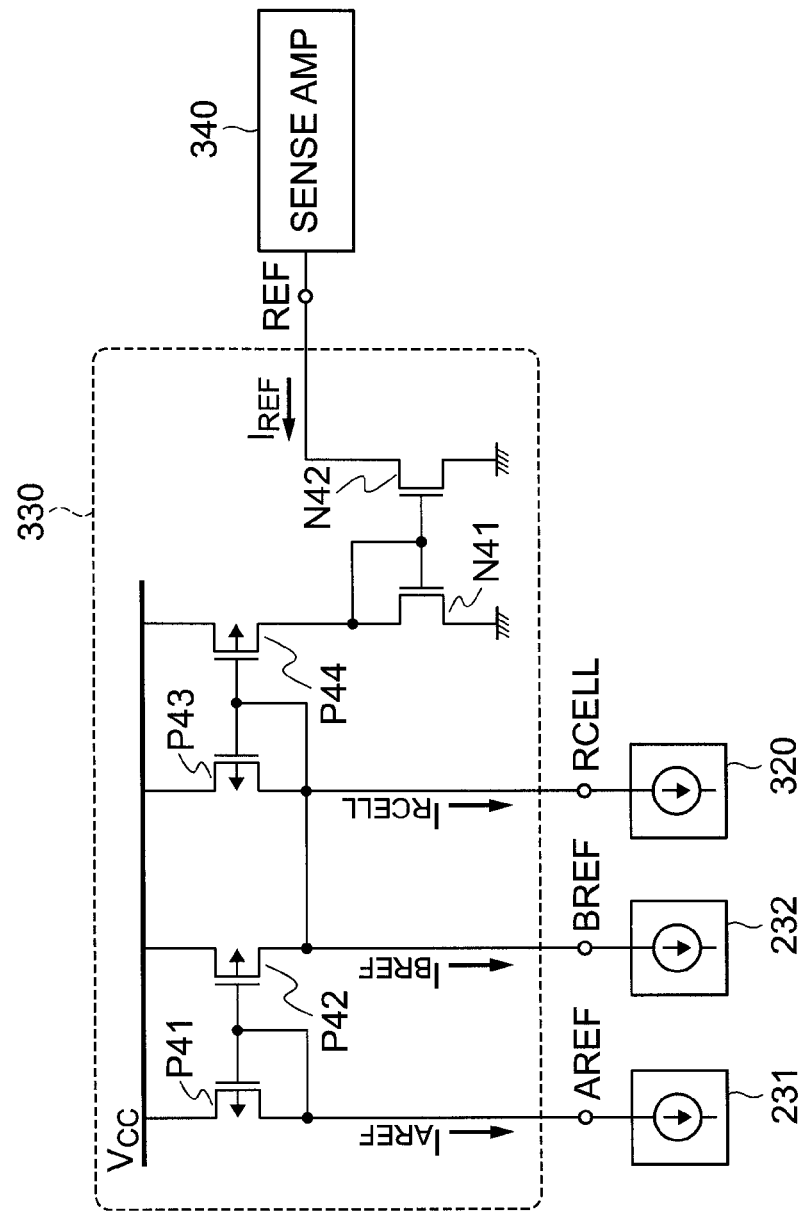
FIG. 11 is a circuit diagram of a reference current source according to the third exemplary embodiment.

FIG. 11 is a circuit diagram of the reference current source 330. The drain terminal of P41 is connected to a REF terminal of the constant current source 231 via an AREF terminal. Further, the gate terminal of P41 is connected to the drain terminal, and the source terminal of P41 is connected to a VCC power supply.

The drain terminal of P42 is connected to a REF terminal of the constant current source 232 via a BREF terminal. The drain terminal of P42 is also connected to an RCELL terminal of the cell current mirror 320 via an RCELL terminal. Further, the gate terminal of P42 is connected to the gate terminal of P41, and the source terminal of P42 is connected to the VCC power supply. P41 and P42 form a current mirror circuit, and are configured by transistors of the same size.

The drain terminal of P43 is, like the drain terminal of P42, connected to the constant current source 232 and the cell current mirror 320. Further, the gate terminal of P43 is connected to the drain terminal, and the source terminal of P43 is connected to the VCC power supply.

The drain terminal of P44 is connected to the drain terminal of N41. Further, the gate terminal of P44 is connected to the gate terminal of P43, and the source terminal of P44 is connected to the VCC power supply. P43 and P44 form a current mirror circuit, and are configured by transistors of the same size.

The drain terminal of N41 is connected to the drain terminal of P44. Further, the gate terminal of N41 is connected to the drain terminal, and the source terminal of N41 is grounded.

The drain terminal of N42 is connected to the sense amp 340 via a REF terminal. Further, the gate terminal of N42 is connected to the gate terminal of N41, and the source terminal of N42 is grounded. N41 and N42 form a current mirror circuit and are configured by transistors of the same size.

Figure 12:
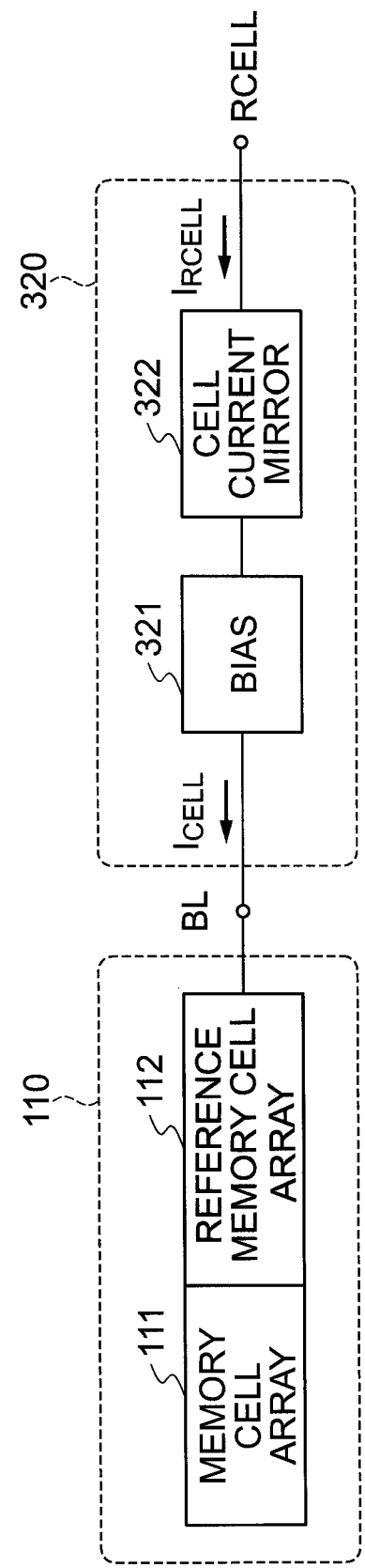
FIG. 12 is a block diagram of a memory cell array and a cell current mirror according to the third exemplary embodiment.

FIG. 12 is a block diagram showing the configurations of the memory cell array 110 and the cell current mirror 320. The memory cell array 110 is configured to include a memory cell array 111 and a reference memory cell array 112. The cell current mirror 320 is configured to include a bias 321 and a cell current mirror 322.

Figure 13:
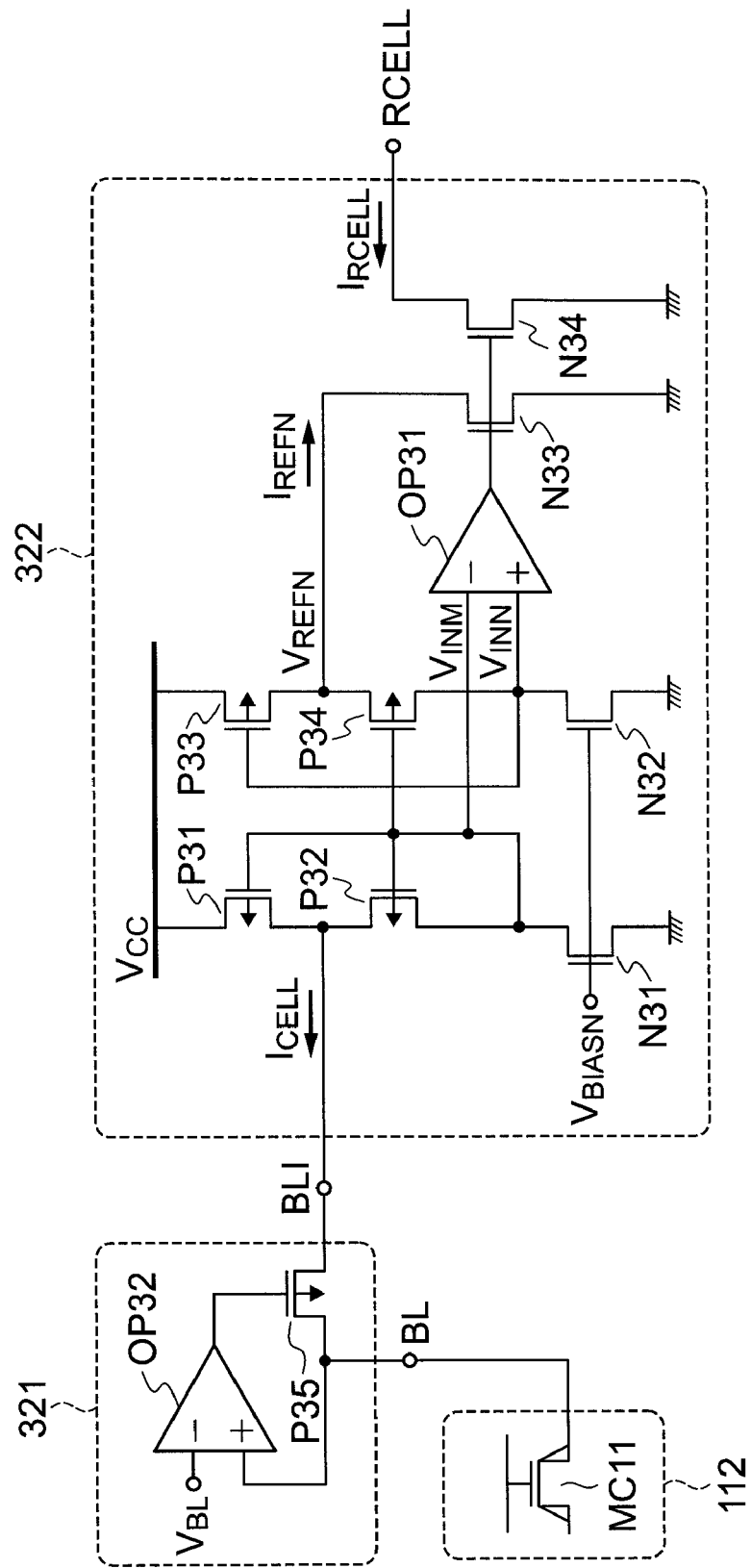
FIG. 13 is a circuit diagram of the cell current mirror according to the third exemplary embodiment.

FIG. 13 is one example of a circuit configured by the reference memory cell array 112, the bias 321 and the cell current mirror 322. The reference memory cell array 112 is shown with only one reference memory cell MC11.

The gate terminal and the source terminal of MC11 included in the reference memory cell array 112 are, like a memory cell (not shown) that becomes a readout target in the memory cell array 111, connected to a power supply to which a predetermined voltage is supplied.

The drain terminal of P31 is connected to the source terminal of P32. The drain terminal of P31 is also connected to a BLI terminal. Further, the gate terminal of P31 is connected to a VINM node, and the source terminal of P31 is connected to a VCC power supply.

The drain terminal and the gate terminal of P32 are connected to the VINM node. Further, the source terminal of P32 is connected to the drain terminal of P31. The source terminal of P32 is also connected to the BLI terminal.

The gate terminals of N31 and N32 are connected to a VBIASN power supply, and the source terminals of N31 and N32 are grounded. Further, the drain terminal of N31 is connected to the VINM node. Further, the drain terminal of N32 is connected to a VINN node.

The drain terminal of P33 is connected to the source terminal of P34. The drain terminal of P33 is also connected to the drain terminal of N33 via a VREFN node. Further, the gate terminal of P33 is connected to the VINN node, and the source terminal of P33 is connected to the VCC power supply.

The drain terminal of P34 is connected to the VINN node, and the gate terminal of P34 is connected to the VINM node. Further, the source terminal of P34 is connected to the drain terminal of P33. The source terminal of P34 is also connected to the drain terminal of N33 via the VREFN node.

The + terminal of OP31 is connected to the VINN node, and the − terminal of OP31 is connected to the VINM node. Further, the output terminal of OP31 is connected to the gate terminals of N33 and N34.

The gate terminals of N33 and N34 are connected to the output terminal of OP31, and the source terminals of N33 and N34 are grounded. Further, the drain terminal of N33 is connected to the VREFN node. Further, the drain terminal of N34 is connected to an RCELL terminal.

The drain terminal of P35 is connected to the + terminal of OP32. The drain terminal of P35 is also connected to the drain terminal of MC11. Further, the gate terminal of P35 is connected to the output terminal of OP32, and the source terminal of P35 is connected to the BLI terminal.

The − terminal of OP32 is connected to a VBL power supply. The + terminal of OP32 is connected to the drain terminal of P35. The + terminal of OP32 is also connected to the drain terminal of MC11 via a BL terminal. The output terminal of OP32 is connected to the gate terminal of P35. A predetermined voltage applied to the drain terminal of a memory cell that becomes a readout target is used for the VBL power supply.

Other circuit configurations are the same as those of the circuits configuring the readout circuit 100 and the readout circuit 200, so description will be omitted.

Next, the operation of the readout circuit 300 will be described as the operation of the third exemplary embodiment. Here, IDATA-CELL denotes a current flowing out from the sense amp 340 to the memory cell array 110. Further, IDATA-CELL denotes a memory cell current of a memory cell that becomes the readout target.

Further, ICELL denotes a memory cell current flowing out from the BL terminal of the cell current mirror 320 to the memory cell array 110. IRCELL denotes a current flowing out from the RCELL terminal of the reference current source 330 to the cell current mirror 320. IAREF and IBREF respectively denote currents flowing out from the AREF terminal and the BREF terminal of the reference current source 330 to the constant current sources 231 and 232. IREF denotes a current flowing out from the sense amp 340 to the REF terminal of the reference current source 330. The reference current source 330 generates IREF from IRCELL, IAREF and IBREF. Note that, IREF is used as a reference current.

The sense amp 340 is a current source type. The sense amp 340 compares IREF with outflowing IDATA-CELL and determines the logic level "0" or "1" of data to be read out. The determination result of the sense amp 340 is outputted as an output signal DOUT via the output buffer 150.

Next, the operation of the reference current source 330 will be described. The currents flowing in P41 and P42 are equal because of the current mirror circuit formed by P41 and P42 shown in FIG. 11. Consequently, when IAREF denotes a current flowing out from the AREF terminal, the current flowing in P42 also becomes IAREF.

When IBREF denotes a current flowing out from the BREF terminal, and IRCELL denotes a current flowing out from the RCELL terminal, the sum of the currents flowing in P42 and P43 becomes IBREF+IRCELL. As mentioned above, the current flowing in P42 is IAREF, so the current flowing in P43 becomes IBREF+IRCELL−IAREF. Further, the currents flowing in P43 and P44 are equal because of the current mirror circuit formed by P43 and P44. Consequently, the current flowing in P44 also becomes IBREF+IRCELL−IAREF.

N41 and P44 are connected in series, and the currents flowing in N41 and P44 are equal. Further, the currents flowing in N41 and N42 are equal because of the current mirror circuit formed by N41 and N42. Consequently, when IREF denotes a current flowing in from the REF terminal, IREF=IBREF+IRCELL−IAREF.

Next, the operation of the circuit configured by the reference memory cell array 112, the bias 321 and the cell current mirror 322 will be described.

Here, ICELL denotes a memory cell current flowing out from P31 shown in FIG. 13 to the BLI terminal. This ICELL is a memory cell current flowing out via P35 to MC11. Further, IREFN denotes a current flowing out via the VREFN node from P33 to N33.

The VBIASN power supply is a power supply that outputs a voltage of a predetermined voltage value such that N31 and N32 operate in a saturated region.

First, attention will be given to P31, P32, and N31. P32 and N31 operate in a saturated region. In this case, the voltage of the BLI terminal slightly increases or decreases as ICELL increases or decreases. P32 works as a gate-grounded amplifier circuit. For this reason, the voltage of the VINM node increases or decreases more greatly than the voltage of the BL terminal as ICELL increases or decreases. In the present exemplary embodiment, the voltage of the BLI terminal is about 2.0 [V], for example.

Next, attention will be given to P33, P34, and N32. P34 and N32 operate in a saturated region. In this case, the voltage of the VREFN node slightly increases or decreases as IREFN increases or decreases. P34 works as a gate-grounded amplifier circuit. For this reason, the voltage of the VINN node increases or decreases more greatly than the voltage of the VREFN node as IREFN increases or decreases.

OP31 is a PMOS gate input. The operating conditions of OP31 are VCC−VINM>|VTP| and VCC−VINN>|VTP|. For this reason, VINM and VINN are respectively connected to the gate terminals of PMOS transistors P31 and P33. Because of this, VCC−VINM>|VTP| and VCC−VINN>|VTP| are ensured. Further, by connecting in this manner, there is a feedback effect from the VINM node and the VINN node to the BLI terminal and the VREFN terminal. Thus, in the third exemplary embodiment, circuit operation is stabilized.

The VINM node and the VINN node become the same voltages because of the operation that makes the voltages of the − terminal and the + terminal of OP31 equal. Consequently, the operating conditions of (P31, P32, N31) and (P33, P34, N32) completely match, and ICELL=IREFN. Further, when IRCELL denotes a current flowing in from the RCELL terminal, IRCELL∝IREFN because of the current mirror circuit formed by N33 and N34. Consequently, IRCELL∝ICELL.

The condition of the input voltage of the VINM node for PMOS transistor P31 to be ON can be given by the following expression.

$$V_{CC}-V_{INM}>|V_{TP}| \tag{4}$$

Further, the condition of the input voltage of the VINM node for PMOS transistor P32 to be ON can be given by the following expression.

$$VINM<VREF-|VTP| \tag{5}$$

Here, VREF denotes the voltage of the BLI terminal.

Further, the condition of the input voltage of the VINM node for NMOS transistor N31 to operate in a saturated region can be given by the following expression.

$$V_{INM}>V_{BIASN}-V_{TN} \tag{6}$$

In the cell current mirror 322, the drain terminal and the gate terminal of PMOS transistor P32 are shunted to ensure that expressions (4) and (5) are always satisfied. However, it is necessary to ensure that expression (6) is satisfied because the voltage of VINM also becomes low when the voltage of VREF is low because of expression (5).

In this manner, the cell current mirror 322 can exhibit a normal function as a current mirror circuit, even ICELL flowing out from the drain terminal of PMOS transistor P31 is a small current where PMOS transistor P31 operates in a linear region.

Further, the gates of P32 and P34 are shunted. For this reason, it is not necessary to supply a bias voltage to these gates. For this reason, the third exemplary embodiment can simplify the circuit configuration. Further, in the third exemplary embodiment, a more flexible circuit configuration becomes possible because limitations on the voltage condition of VREF are eased.

The operation of the constant current sources 231 and 232 is the same as the operation described in the second exemplary embodiment, so description will be omitted. However, the third exemplary embodiment can also adjust IREF with high precision by adjusting R21 with a trimming circuit or the like.

IRCELL flowing out from the reference current source 330 to the cell current mirror 320 is proportional to the memory cell current of MC11. MC11 is used in the same condition as a memory cell that becomes a readout target. For this reason, characteristic fluctuation resulting from use conditions, such as a bias voltage and temperature, matches the readout target memory cell. Consequently, IRCELL represents a current value in which characteristic fluctuation of a readout target memory cell can be reflected. Note that, ΔIRCELL denotes change in IRCELL accompanying this characteristic fluctuation.

The current flowing in from the REF terminal of the reference current source 330 is IREF=IBREF+IRCELL-IAREF.

Further, the sense amp 340 is a current source type. The rest is the same as what has been described in each of the preceding exemplary embodiments, so description will be omitted. However, even when a current source type is used for the sense amp, because of IREF of the reference current source 330, the third exemplary embodiment can also realize a reference current source having both characteristic fluctuation matching the memory cell and the precision of the constant current source.

Figure 14:
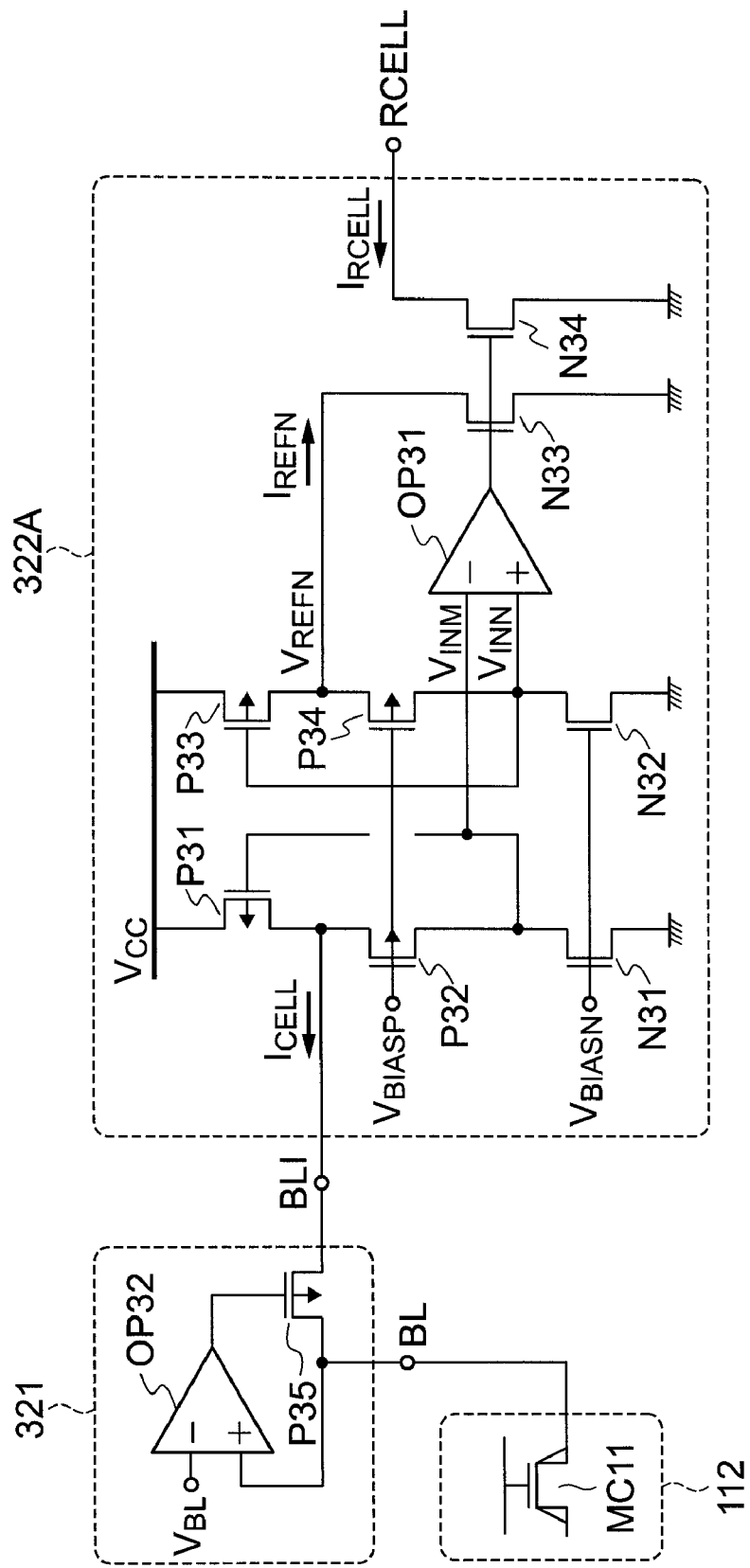
FIG. 14 is a circuit diagram of a cell current mirror according to a modification of the third exemplary embodiment.

The gates of P32 and P34 may also be connected to a VBIASP power supply rather than being shunted, as in a cell current mirror 322A shown in FIG. 14. This VBIASP power supply is set to an appropriate voltage value where P32 and P34 operate in a saturated region.

In this case, the condition of the input voltage of an inverted input terminal VINM for PMOS transistor P31 to be ON can be given by expression (4).

Further, the condition of the input voltage VINM of the VINM node for PMOS transistor P32 to operate in a saturated region can be given by the following expression.

$$VINM < VBIASP + |VTP| \quad (7)$$

Consequently, in the case of VBIASP>VCC−2×|VTP|, the condition of VINM is limited by expression (4), and in the case of VBIASP<VCC−2×|VTP|, the condition of VINM is limited by expression (7).

Further, the condition of the input voltage of the VINM node for NMOS transistor N31 to operate in a saturated region is given by expression (6).

Because of expressions (6) and (7), the condition of the bias voltage is such that it is preferable for the voltage to be as high as possible. Because of this, it is preferable for the condition of the bias voltage to be VBIASP>VCC−2×|VTP|.

Further, the condition of the voltage VREF of the BLI terminal for PMOS transistor P32 to be ON can be given by the following expression.

$$VREF > VBIASP + |VTP| \quad (8)$$

In relation to PMOS transistor P31, basically there are no limitations. Because of expression (8), when the voltage VREF is low, it is necessary to also make the voltage of the bias voltage VBIASP low. However, the bias voltage VBIASP is set so as to satisfy expression (6) and expression (7) which are voltage conditions of the VINM node.

In the cell current mirror 322A, the necessary voltage condition of the BLI terminal from which ICELL flows out becomes VREF>VBIASP+|VTP|>VINM because of expression (7) and expression (8). This voltage condition naturally includes VREF≧VINM+|VTP|. In other words, the voltage condition of the drain terminal of PMOS transistor P31 from which ICELL flows out allows VSDP≦VSGP−|VTP|. VSDP is a voltage between the source terminal and the drain terminal of a PMOS transistor, and VSGP is a voltage between the source terminal and the gate terminal of a PMOS transistor. That is, PMOS transistor P31 operates in a linear region.

In this manner, the cell current mirror 322A can exhibit a normal function as a current mirror circuit even when ICELL flowing out from the drain terminal of PMOS transistor P31 is a small current where PMOS transistor P31 operates in a linear region.

The cell current mirror 322A is useful when one wants to use the drain terminal of an NMOS transistor as the terminal from which IRCELL corresponding to ICELL is outputted.

Fourth Embodiment

Next, a fourth exemplary embodiment of the present invention will be described. The same signs will be given to portions that are the same as those in each of the preceding exemplary embodiments, and detailed description of those same portions will be omitted.

Figure 15:
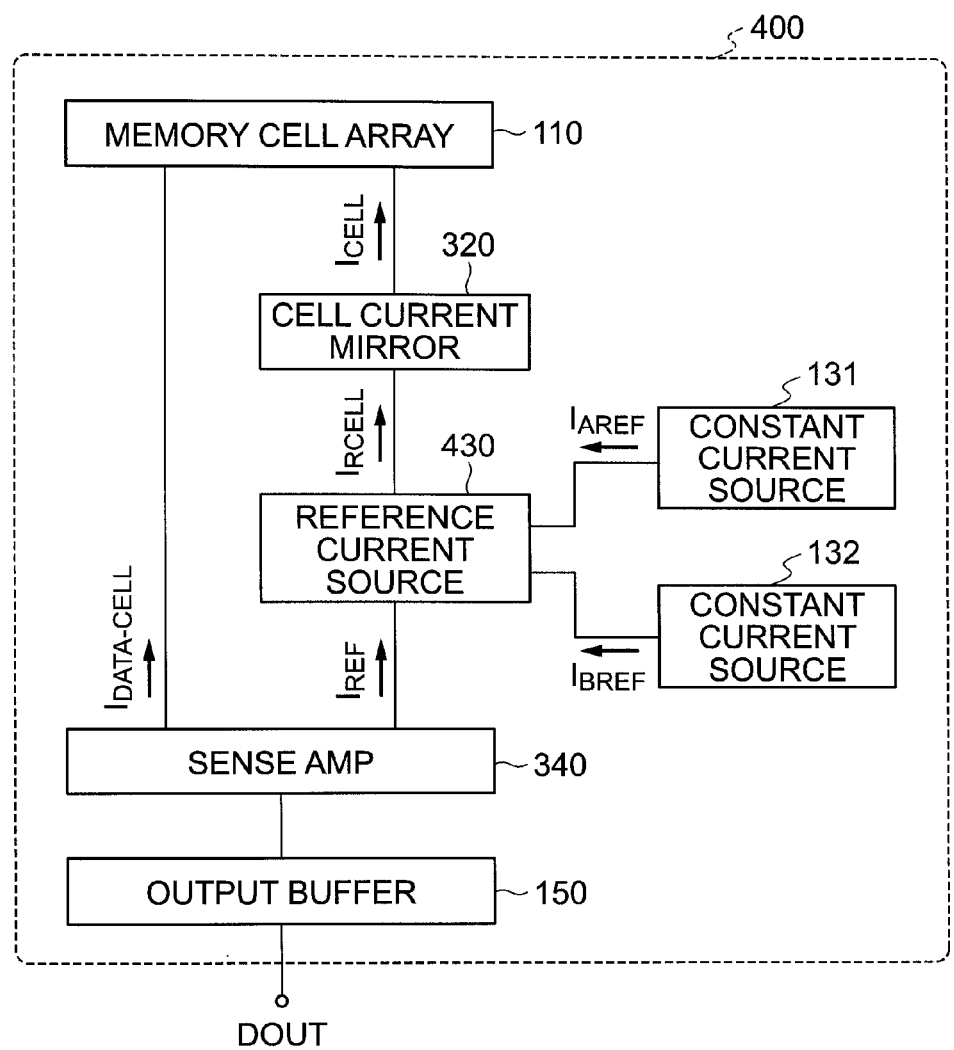
FIG. 15 is a block diagram of a readout circuit according to a fourth exemplary embodiment.

FIG. 15 shows a block diagram showing the general configuration of a readout circuit 400 according to the present exemplary embodiment. As shown in FIG. 15, the readout circuit 400 uses a reference current source 430 instead of the reference current source 330 of the readout circuit 300 described in the third exemplary embodiment. The readout circuit 400 also uses the constant current sources 131 and 132 of the readout circuit 100 instead of the constant current sources 231 and 232 of the readout circuit 300 described in the third exemplary embodiment.

As shown in FIG. 15, the readout circuit 400 is configured to include a memory cell array 110, a cell current mirror 320, the reference current source 430, the constant current sources 131 and 132, a sense amp 340, and an output buffer 150.

Figure 16:
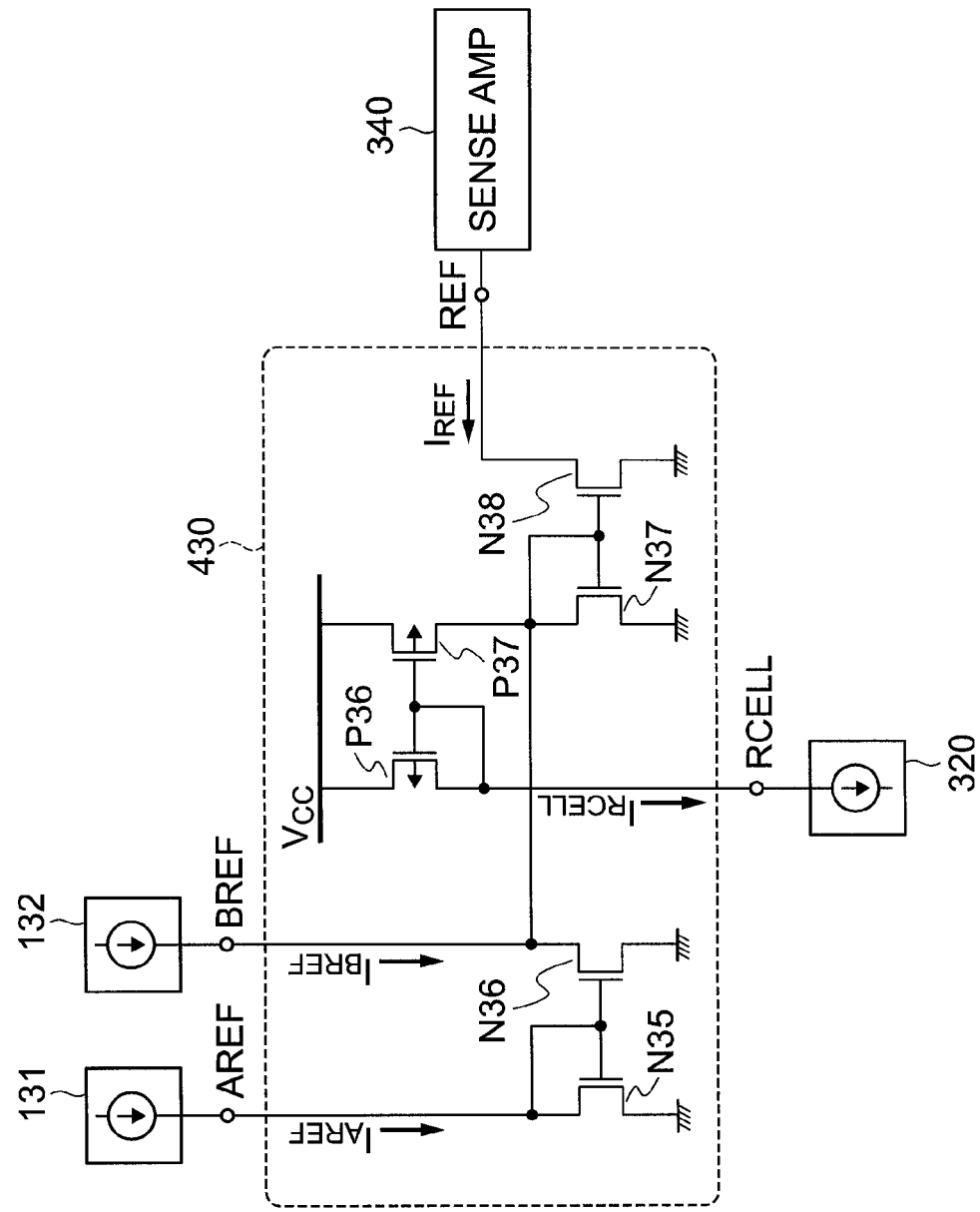
FIG. 16 is a circuit diagram of a reference current source according to the fourth exemplary embodiment.

FIG. 16 is a circuit diagram of the reference current source 430. The drain terminal of N35 is connected to a REF terminal of the constant current source 131 via an AREF terminal. Further, the gate terminal of N35 is connected to the drain terminal, and the source terminal of N35 is grounded.

The drain terminal of N36 is connected to a REF terminal of the constant current source 132 via a BREF terminal. The drain terminal of N36 is also connected to the drain terminals of P37 and N37. Further, the gate terminal of N36 is connected to the gate terminal of N35, and the source terminal of N36 is grounded. N35 and N36 form a current mirror circuit and are configured by transistors of the same size.

The drain terminal of P36 is connected to an RCELL terminal of the cell current mirror 320 via an RCELL terminal. Further, the gate terminal of P36 is connected to the drain terminal, and the source terminal of P36 is connected to a VCC power supply.

The drain terminal of P37 is connected to the REF terminal of the constant current source 132 via the BREF terminal. The drain terminal of P37 is also connected to the drain terminals of N36 and N37. Further, the gate terminal of P37 is connected to the gate terminal of P36, and the source terminal of P37 is connected to the VCC power supply. P36 and P37 form a current mirror circuit and are configured by transistors of the same size.

The drain terminal of N37 is connected to the REF terminal of the constant current source 132 via the BREF terminal. The drain terminal of N37 is also connected to the drain terminals of N36 and P37. Further, the gate terminal of N37 is connected to the drain terminal, and the source terminal of N37 is grounded.

The drain terminal of N38 is connected to the sense amp 340 via a REF terminal. Further, the gate terminal of N38 is connected to the gate terminal of N37, and the source terminal of N38 is grounded. N37 and N38 form a current mirror circuit and are configured by transistors of the same size.

Other circuit configurations are the same as those of the circuits configuring the readout circuit 100 and the readout circuit 300, so description will be omitted.

Next, the operation of the readout circuit 400 will be described as the operation of the present fourth exemplary embodiment. Here, IAREF and IBREF respectively denote currents flowing from the constant current sources 131 and 132 into the reference current source 430.

First, the operation of the reference current source 430 will be described. The currents flowing in N35 and N36 are equal because of the current mirror circuit formed by N35 and N36 shown in FIG. 16. Consequently, when IAREF denotes a current flowing in from the AREF terminal, the current flowing in N36 also becomes IAREF.

The currents flowing in P36 and P37 are equal because of the current mirror circuit formed by P36 and P37. Consequently, when IRCELL denotes a current flowing out from the RCELL terminal, the current flowing in P37 also becomes IRCELL.

When IBREF denotes a current flowing in from the BREF terminal, the sum of the currents flowing in N36 and N37 becomes IBREF+IRCELL. As mentioned above, the current flowing in N36 is IAREF. Consequently, the current flowing in N37 becomes IBREF+IRCELL−IAREF. Further, the currents flowing in N37 and N38 are equal because of the current mirror circuit formed by N37 and N38. Consequently, when IREF denotes a current flowing in from the REF terminal, IREF=IBREF+IRCELL−IAREF.

Other operations are the same as the operations of the readout circuit 100 and the readout circuit 300, so description will be omitted.

Description in regard to fluctuation of the reference current IREF, when ΔIAREF and ΔIBREF respectively denote change in IAREF and IBREF accompanying characteristic fluctuation of the constant current sources 131 and 132, is the same as in the preceding exemplary embodiments, so it will be omitted. However, the readout circuit 400 also has the same effects as those of the readout circuits described in the preceding exemplary embodiments. That is, because of IREF of the reference current source 430, the readout circuit 400 according to the fourth exemplary embodiment can realize a reference current having both characteristic fluctuation matching the memory cell and the precision of the constant current source.

Fifth Exemplary Embodiment

Next, a fifth exemplary embodiment of the present invention will be described. The same signs will be given to portions that are the same as those in the preceding exemplary embodiments, and detailed description of those same portions will be omitted.

FIG. 17A is a circuit diagram of a reference memory cell array 113 according to the present exemplary embodiment. Note that, only two reference memory cells MC31 and MC32 are shown. FIG. 17B is a circuit diagram of the reference memory cell array 114 according to the present exemplary embodiment. Note that, only two reference memory cells MC33 and MC34 are shown.

First, the reference memory cell array 113 will be described. The drain terminals of MC31 and MC32 are connected to each other. The gate terminals and the source terminals of MC31 and MC32 are also similarly connected to each other.

The reference memory cell array 113 can replace and be used instead of the reference memory cell array 112 described in each of the preceding exemplary embodiments. Like MC11 of the reference memory cell array 112, the source terminals or the drain terminals of MC31 and MC32 are connected to the BL terminal of the cell current mirror 120 or 320. The other terminals are, like a memory cell (not shown) that becomes the readout target in the memory cell array 111, connected to a voltage source to which a predetermined voltage is supplied.

Next, the reference memory cell array 114 will be described. The drain terminals of MC33 and MC34 are connected to each other. The source terminals of MC33 and MC34 are also similarly connected to each other.

The reference memory cell array 114 can replace and be used instead of the reference memory cell array 112 described in each of the preceding exemplary embodiments. Like MC11 of the reference memory cell array 112, the source terminals or the drain terminals of MC33 and MC34 are connected to the BL terminal of the cell current mirror 120 or 320. The other terminals are, like a memory cell (not shown) that becomes a readout target in the memory cell array 111, connected to a voltage source to which a predetermined voltage is supplied.

Next, the operation of the reference memory cell array 113 will be described. In the reference memory cell array 113, in contrast to the reference memory cell array 112, plural reference memory cells are connected to the BL terminal. Consequently, the sum of the memory cell currents of M31 and M32 flows in the cell current mirror via the BL terminal.

Next, the operation of the reference memory cell array 114 will be described. In the reference memory cell array 114, in contrast to the reference memory cell array 112, plural reference memory cells are connected to the BL terminal. Consequently, the sum of the memory cell currents of MC33 and MC34 flows in the cell current mirror via the BL terminal.

By using the reference memory cell array 113 or the reference memory cell array 114, plural reference memory cell currents can be used. Thus, for example, memory cells of logic levels "0" and "1" and memory cells adjusted to a reference current at the time of writing and a reference current at the time of erasure can be used. Further, in the fifth exemplary embodiment, even when the memory cell current is adjusted to a single memory cell current value, the memory cell current is averaged by plural memory cells. For this reason, in the fifth exemplary embodiment, the reference current value can be stabilized.

In the present fifth exemplary embodiment, there has been described a case where two reference memory cells are used. However, even more reference memory cells may also be used. Further, the memory cells connection method may also be a circuit configuration other than that of the reference memory cell array 113 or the reference memory cell array 114.

Sixth Exemplary Embodiment

Next, a sixth exemplary embodiment of the present invention will be described. The same signs will be given to portions that are the same as those in each of the preceding exemplary embodiments, and detailed description of those same portions will be omitted.

Figure 18:
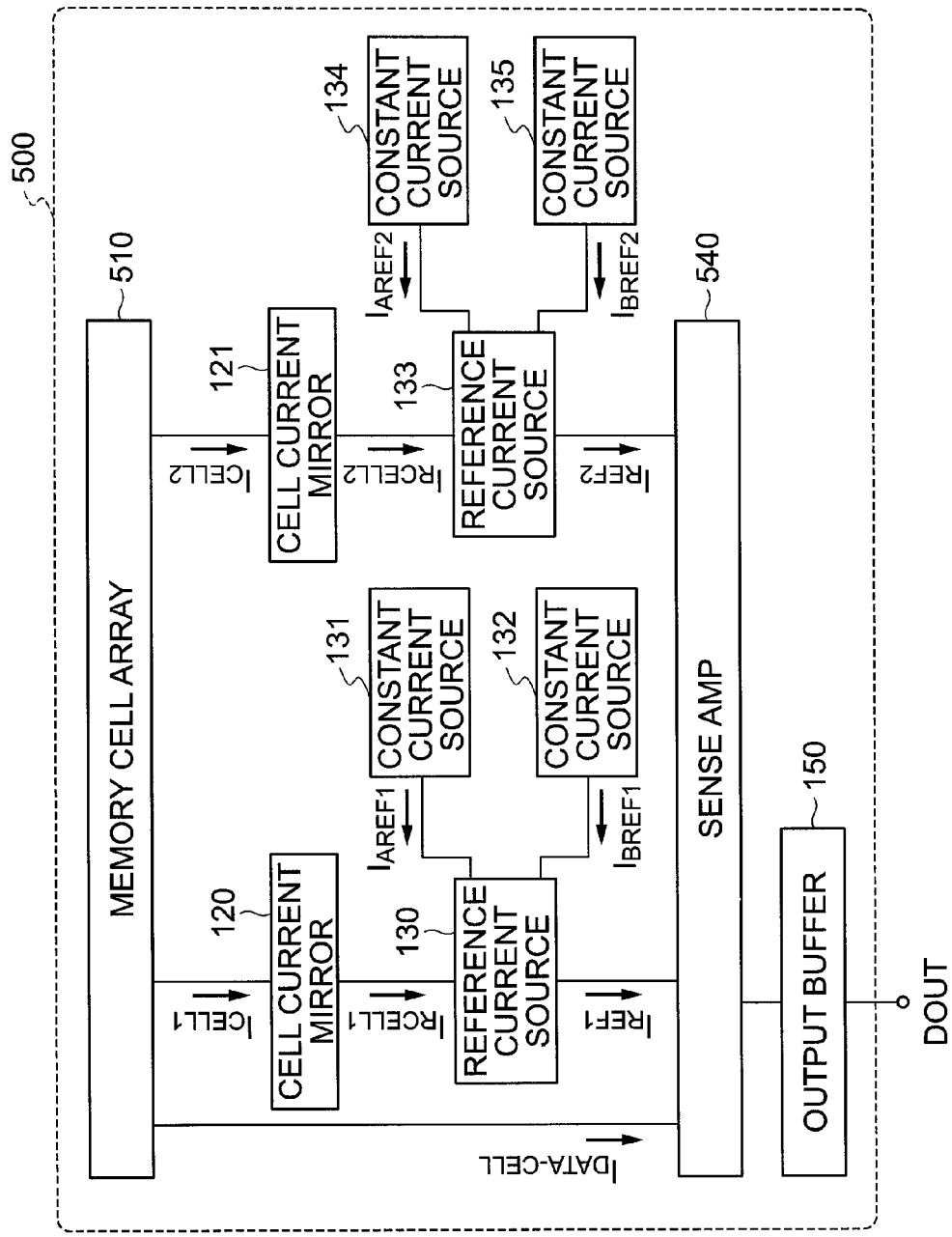
FIG. 18 is a block diagram of a readout circuit according to a sixth exemplary embodiment.
Figure 26A:
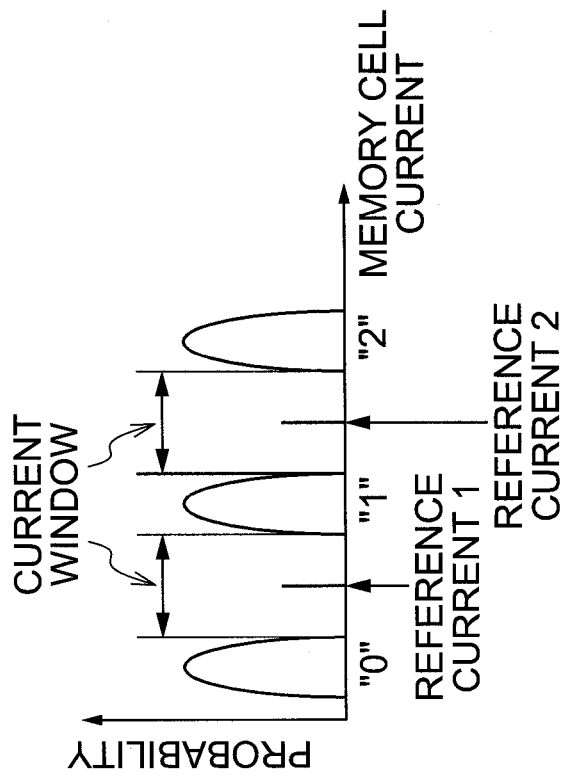
FIG. 26A and FIG. 26B are diagrams showing the relationship between a memory cell current and a reference current.
Figure 26B:
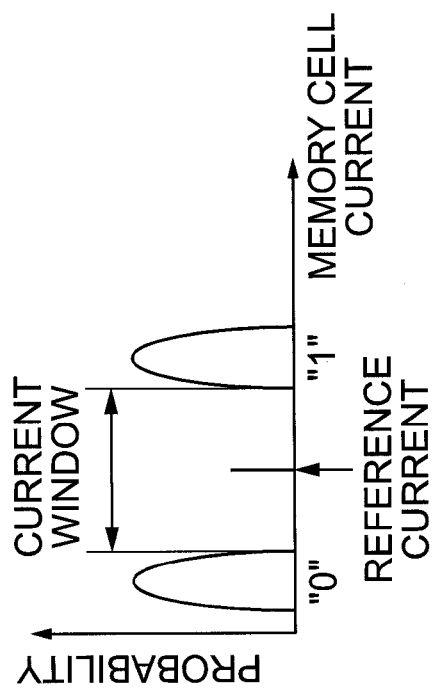
Figure 28A:
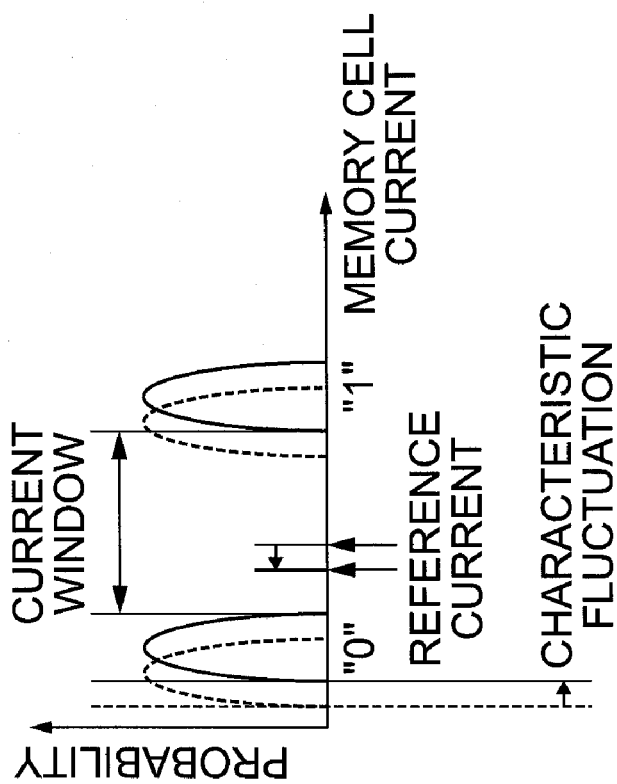
FIG. 28A and FIG. 28B are diagrams showing the relationship between a memory cell current and a reference current.
Figure 28B:
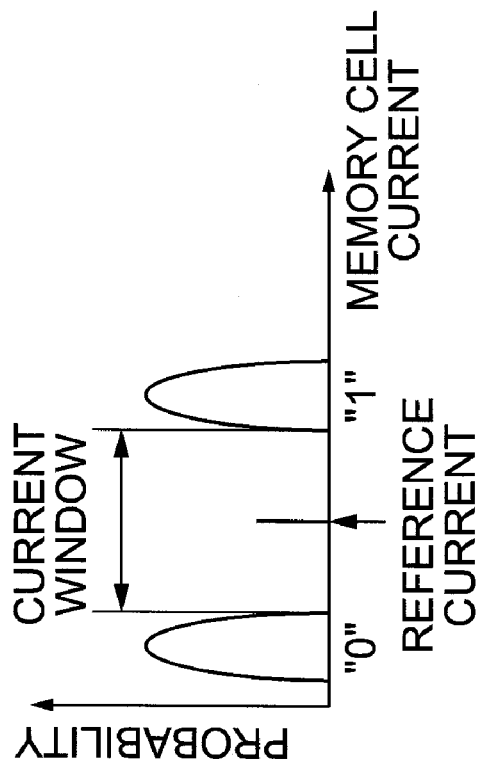

FIG. 18 is a block diagram showing the configuration of a readout circuit 500 according to the sixth exemplary embodiment. As shown in FIG. 18, the readout circuit 500 is configured to include a memory cell array 510, cell current mirrors 120 and 121, reference current sources 130 and 133, constant current sources 131, 132, 134 and 135, a sense amp 540, and an output buffer 150. The memory cells configuring the memory cell array 510 are multiple-value memory cells. The multiple-value memory cells have plural current windows as shown in FIG. 26B, and a reference current becomes necessary for each current window.

Figure 19A:
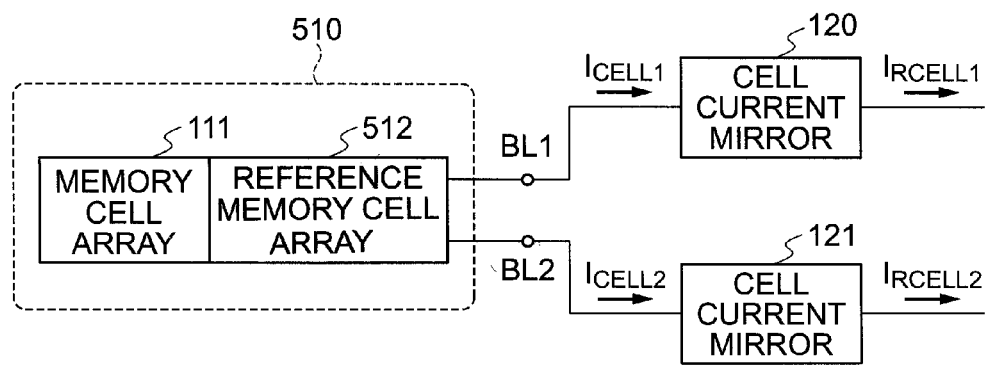
FIG. 19A is a block diagram of a memory cell array according to the sixth exemplary embodiment.
Figure 19B:
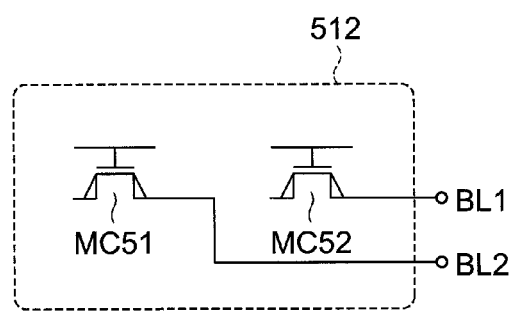
FIG. 19B is a circuit diagram of a reference memory cell array according to the sixth exemplary embodiment.

FIG. 19A is a block diagram of a circuit configured by the memory cell array 510 and the cell current mirrors 120 and 121. FIG. 19B is a circuit diagram of a reference memory cell array 512. Note that, only two reference memory cells MC51 and MC52 are shown.

The source terminal of MC51 is connected to a BL terminal of the cell current mirror 120 via a BL1 terminal. The source terminal of MC52 is connected to a BL terminal of the cell current mirror 121 via a BL2 terminal. Terminals other than these are, like a memory cell (not shown) that becomes the readout target in the memory cell array 111, connected to a voltage source to which a predetermined voltage is supplied.

The cell current mirror 121 has the same circuit configuration as the cell current mirror 120. The reference current source 133 has the same circuit configuration as the reference current source 130. The constant current sources 134 and 135 have the same circuit configurations as the constant current source 131.

The RCELL terminal of the reference current source 130 is connected to the RCELL terminal of the cell current mirror 120. The AREF terminal and the BREF terminal of the reference current source 130 are respectively connected to the REF terminals of the constant current sources 131 and 132. The REF terminal of the reference current source 130 is connected to the sense amp 540.

The RCELL terminal of the reference current source 133 is connected to the RCELL terminal of the cell current mirror 121. The AREF terminal and the BREF terminal of the reference current source 133 are respectively connected to the REF terminals of the constant current sources 134 and 135. The REF terminal of the reference current source 133 is connected to the sense amp 540.

Other circuit configurations are the same as those of the circuits configuring the readout circuit 100, so description will be omitted.

Here, IDATA-CELL denotes a current flowing from the memory cell array 510 into the sense amp 540. IDATA-CELL is a memory cell current of a memory cell that becomes the readout target.

Further, ICELL1 denotes a memory cell current flowing from the memory cell array 510 into the BL terminal of the cell current mirror 120. IRCELL1 denotes a current flowing from the cell current mirror 120 via the RCELL terminal into the reference current source 130. IAREF1 and IBREF1 respectively denote currents flowing from the constant current sources 131 and 132 via the REF terminals into the AREF terminal and the BREF terminal of the constant current source 130. IREF1 denotes a current flowing from the reference current source 130 via the REF terminal into the sense amp 540. The reference current source 130 generates IREF1 from IRCELL1, IAREF1 and IBREF1. Note that, IREF1 is used as a reference current that determines logic levels "0" and "1".

ICELL2 denotes a memory cell current flowing from the memory cell array 510 into the BL terminal of the cell current mirror 121. IRCELL2 denotes a current flowing from the cell current mirror 121 via the RCELL terminal into the reference current source 133. IAREF2 and IBREF2 respectively denote currents flowing from the constant current sources 134 and 135 via the REF terminals into the AREF terminal and the BREF terminal of the reference current source 133. IREF2 denotes a current flowing from the reference current source 133 via the REF terminal into the sense amp 540. The reference current source 133 generates IREF2 from IRCELL2, IAREF2 and IBREF2. Note that, IREF2 is used as a reference current that determines logic levels "1" and "2".

The sense amp 540 is a current sink type. The sense amp 540 compares inflowing IREF1 and IREF2 to IDATA-CELL and determines the logic level of data to be read out. The determination result of the sense amp 540 is outputted via the output buffer 150.

The operation of the reference current source 130 is the same as in the case of the readout circuit 100. Consequently, when IREF1 denotes a current flowing out from the REF terminal, IREF1=IBREF1+IRCELL1−IAREF1. The operation of the reference current source 133 is the same, and IREF2=IBREF2+IRCELL2−IAREF2.

Other circuit operations are the same as those of the readout circuit 100, so description will be omitted.

The operation of the reference current source 130 is the same as in the case of the readout circuit 100. Consequently, when ΔIRCELL1 denotes change in IRCELL1 accompanying characteristic fluctuation, IREF1≈IRCELL1+ΔIRCELL1. The operation of the reference current source 131 is the same, and when ΔIRCELL2 denotes change in IRCELL2 accompanying characteristic fluctuation, IREF2≈IRCELL2+ΔIRCELL2.

Other description is the same as that in the first exemplary embodiment, so it will be omitted. Further, the effects of the readout circuit 500 according to the sixth exemplary embodiment are the same as those of the readout circuit 100 of the first exemplary embodiment. Namely, because of IREF1 and IREF2 of the reference current sources 130 and 133, the readout circuit 500 according to the sixth exemplary embodiment can realize a reference current source having both characteristic fluctuation matching the memory cell and the precision of the constant current source even when using multiple-value memory cells. Further, the readout circuit 500 according to the sixth exemplary embodiment uses the separate reference memory cells MC51 and MC52 for generating IREF1 and IREF2. Consequently, the readout circuit 500 according to the sixth exemplary embodiment can generate IREF1 and IREF2 with high precision.

In the sixth exemplary embodiment, three-value memory cells were described. However, the present invention can also similarly handle four-value or higher multiple-value memories by adding a cell current mirror, a reference current source and two constant current sources and increasing the reference currents.

Seventh Exemplary Embodiment

Next, a seventh exemplary embodiment of the present invention will be described. The same signs will be given to portions that are the same as those in each of the preceding exemplary embodiments, and detailed description of those same portions will be omitted.

Figure 20:
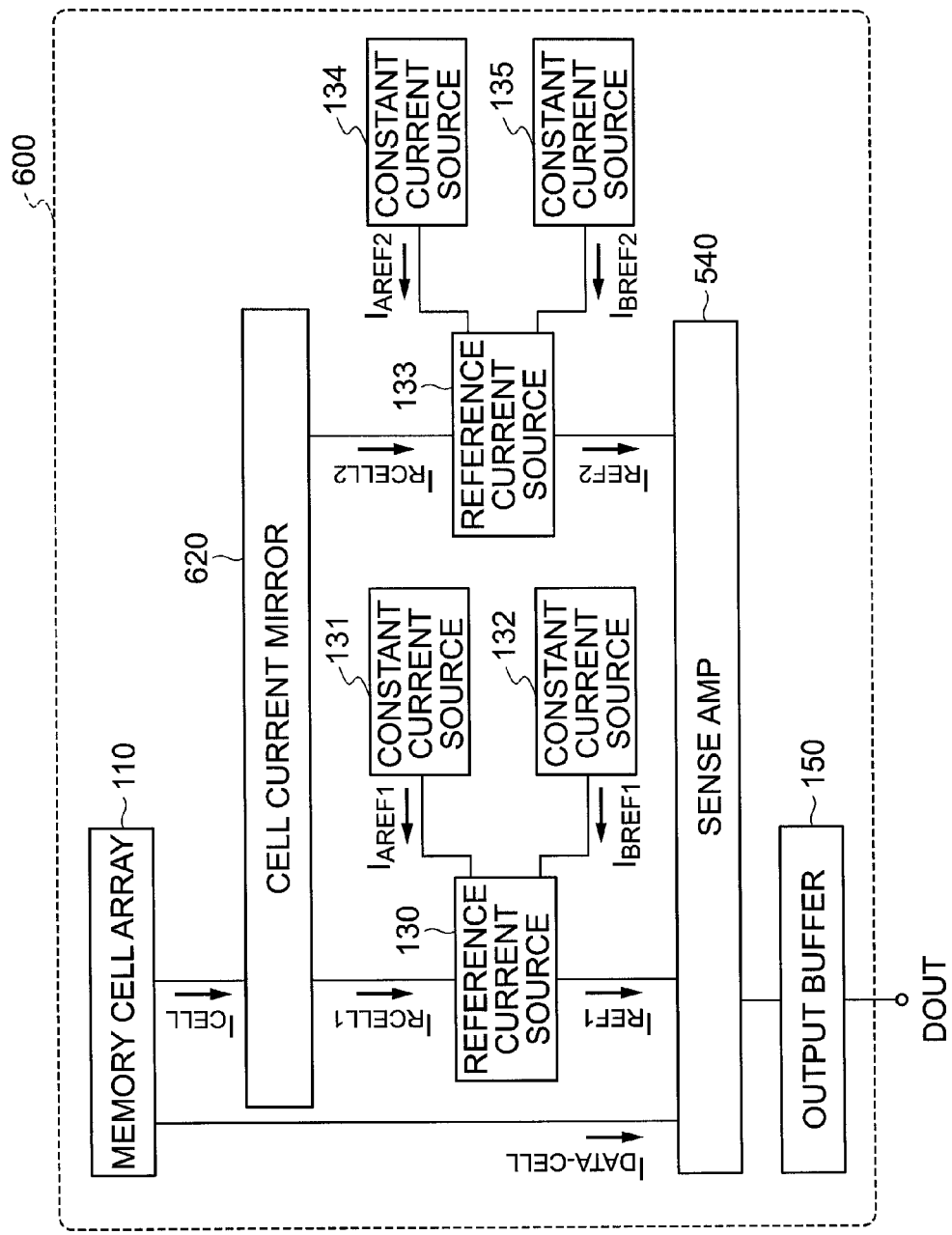
FIG. 20 is a block diagram of a readout circuit according to a seventh exemplary embodiment.

FIG. 20 is a block diagram showing the configuration of a readout circuit 600 according to the seventh exemplary embodiment. The readout circuit 600 is configured to include a memory cell array 110, a cell current mirror 620, reference current sources 130 and 133, constant current sources 131, 132, 134 and 135, a sense amp 540, and an output buffer 150. The memory cells configuring the memory cell array 110 are multiple-value memory cells.

Figure 21:
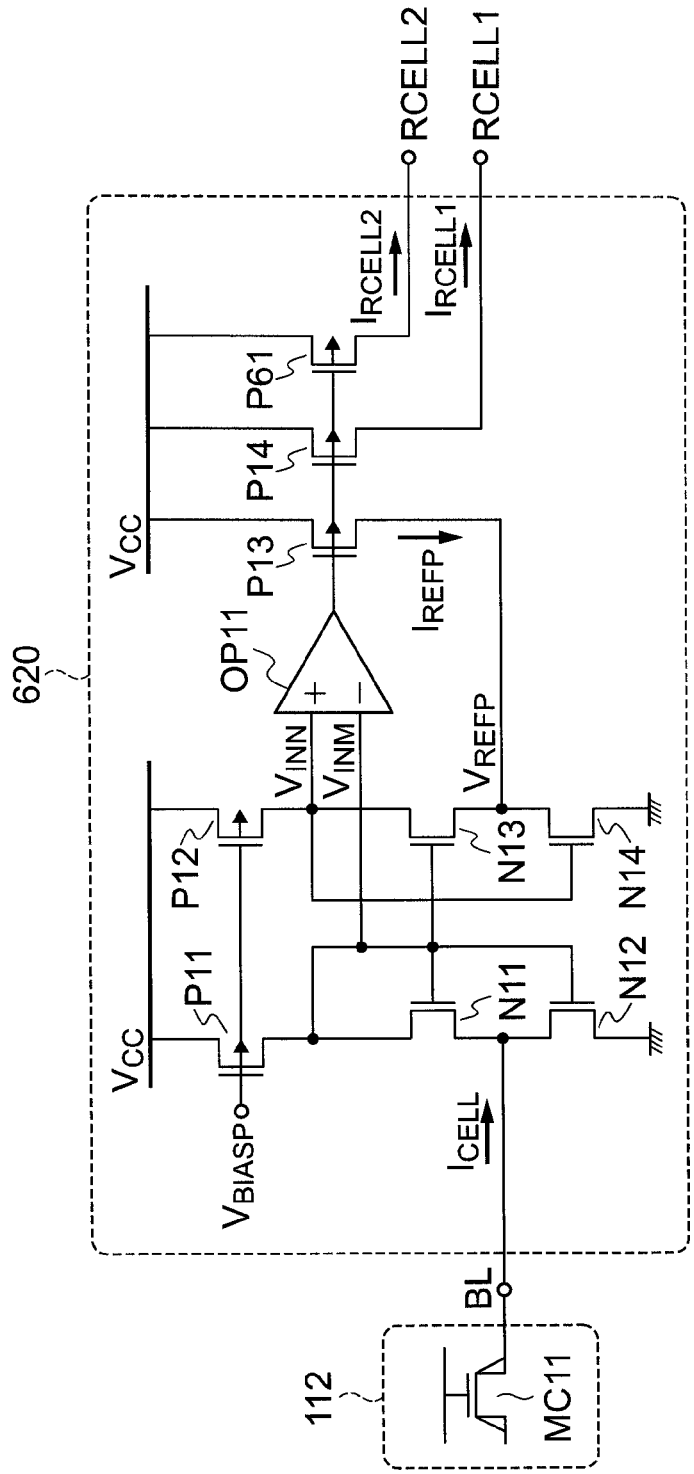
FIG. 21 is a circuit diagram of a cell current mirror according to the seventh exemplary embodiment.

FIG. 21 is one example of a circuit configured by a reference memory cell array 112 and the cell current mirror 620. Note that, the reference memory cell array 112 is shown with only one reference memory cell MC11.

The configuration of the circuit excluding P14 and P61 is the same as that of the circuit configured by the reference memory cell array 112 and the cell current mirror 120 (see FIG. 4), so description will be omitted. The gate terminals of P14 and P61 are connected to the output terminal of OP11, and the source terminals of P14 and P61 are connected to a VCC power supply. Further, the drain terminal of P14 is connected to an RCELL1 terminal. The drain terminal of P61 is connected to an RCELL2 terminal. P13 and P14 form a current mirror circuit. Further, P13 and P61 form a current mirror circuit.

Here, IDATA-CELL denotes a current flowing from the memory cell array 110 into the sense amp 540. IDATA-CELL is a memory cell current that becomes the readout target.

Further, ICELL denotes a memory cell current flowing from the memory cell array 110 into the BL terminal of the cell current mirror 620. IRCELL1 denotes a current flowing from the cell current mirror 620 via the RCELL1 terminal into the RCELL terminal of the reference current source 130. IRCELL 2 denotes a current flowing from the cell current mirror 620 via the RCELL2 terminal into the RCELL terminal of the reference current source 133.

Next, the operation of the circuit configured by the reference memory cell array 112 and the cell current mirror 620 will be described. The operation of the circuit excluding P14 and P61 is the same as that of the circuit configured by the reference memory cell array 112 and the cell current mirror 120 (see FIG. 4), so description will be omitted. When IRCELL1 denotes a current flowing out from the RCELL1 terminal, becomes IRCELL1∝IREFP because of the current mirror circuit formed by P13 and P14. Consequently, becomes IRCELL1∝ICELL. Similarly, when IRCELL2 denotes a current flowing out from the RCELL2 terminal, becomes IRCELL2∝ICELL. IRCELL1 and IRCELL2 differ only in their mirror ratios and are both ICELL mirror currents.

Other circuit operations are the same as those of the readout circuit 500, so description will be omitted.

In the seventh exemplary embodiment, the same memory cell current is used to generate IRCELL1 and IRCELL2. Consequently, the seventh exemplary embodiment can reduce the circuit scale of the cell current mirror. IRCELL1 and IRCELL2 are both mirror currents of memory cell currents. Consequently, IRCELL1 and IRCELL2 show characteristic fluctuation matching the memory cell current. Thus, the seventh exemplary embodiment can realize the same effects as those of the sixth exemplary embodiment while reducing the circuit scale.

Eighth Exemplary Embodiment

Next, an eighth exemplary embodiment of the present invention will be described. The same signs will be given to portions that are the same as those in each of the preceding exemplary embodiments, and detailed description of those same portions will be omitted.

Figure 22:
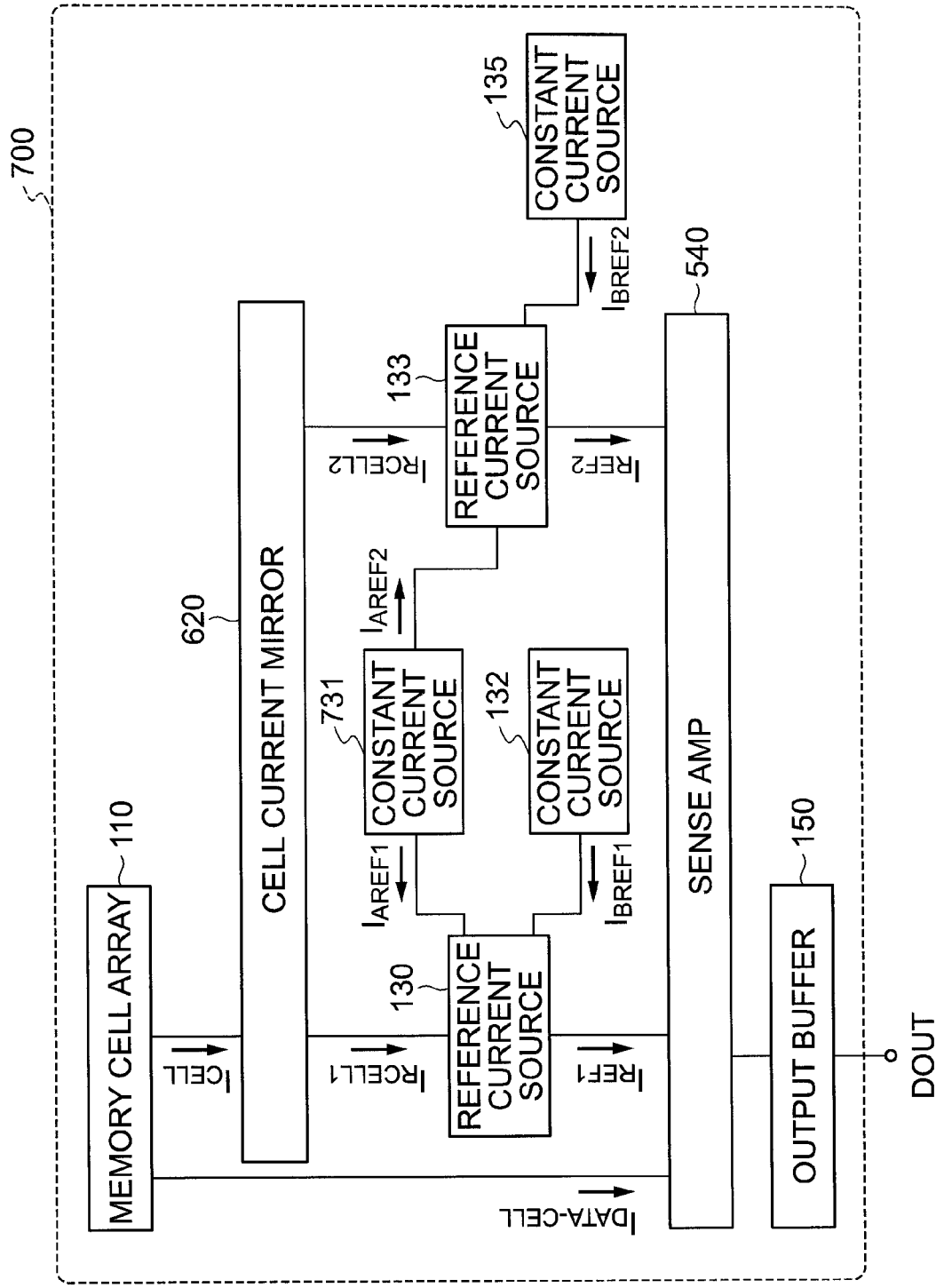
FIG. 22 is a block diagram of a readout circuit according to an eighth exemplary embodiment.

FIG. 22 is a block diagram showing the configuration of a readout circuit 700 according to the eighth exemplary embodiment. The readout circuit 700 is configured to include a memory cell array 110, a cell current mirror 620, reference current sources 130 and 133, constant current sources 731, 132 and 135, a sense amp 540, and an output buffer 150. The memory cells configuring the memory cell array 110 are multiple-value memory cells.

Figure 23:
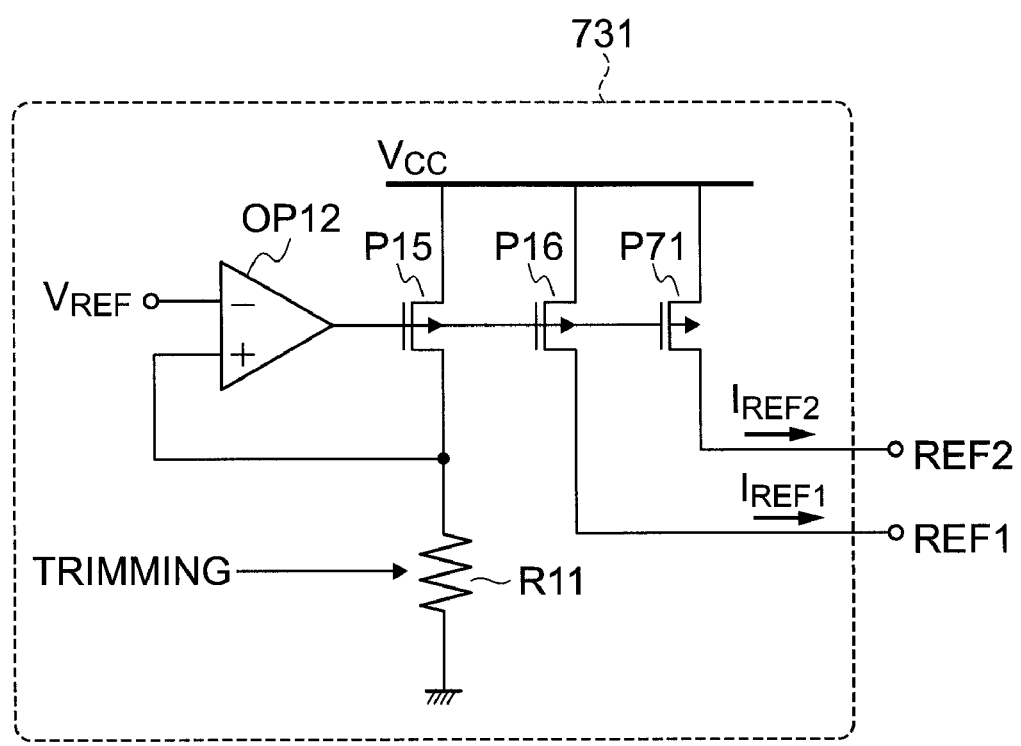
FIG. 23 is a circuit diagram of a constant current source according to the eighth exemplary embodiment.

FIG. 23 is one example of a circuit that realizes the constant current source 731. The configuration of the circuit excluding P16 and P71 (constant current generating section) is the same as that of the constant current source 131 (see FIG. 5), so description will be omitted. The gate terminals of P16 and P71 are connected to the output terminal of OP12, and the source terminals of P16 and P71 are connected to a VCC power supply. Further, the drain terminal of P16 is connected to a REF1 terminal. The drain terminal of P71 is connected to a REF2 terminal. P15 and P16 form a current mirror circuit. P15 and P71 also form a current mirror circuit.

IAREF1 denotes a current flowing from the constant current source 731 via the REF1 terminal into the AREF terminal of the constant current source 130. IAREF2 denotes a current flowing from the constant current source 731 via the REF2 terminal into the AREF terminal of the reference current source 133.

Next, the operation of the constant current source 731 will be described. The operation of the circuit excluding P16 and P71 is the same as that of the constant current source 131 (see FIG. 5), so description will be omitted. When IREF1 denotes a current flowing out from the REF1 terminal, becomes IREF1∝VREF/R11 because of the current mirror circuit formed by P15 and P16. Similarly, when IREF2 denotes a current flowing out from the REF2 terminal, becomes IREF2∝VREF/R11. IREF1 and IREF2 differ only in their mirror ratios and are both mirror currents of VREF/R11. Consequently, when this constant current source is used, IREF1 and IREF2 can be adjusted with high precision by adjusting R11 with a trimming circuit or the like.

Other circuit operations are the same as those of the readout circuit 600, so description will be omitted.

In the eighth exemplary embodiment, the constant current source 731 is used to generate IAREF1 and IAREF2. Consequently, the eighth exemplary embodiment can reduce the circuit scale of a constant current source. Consequently, the eighth exemplary embodiment can realize the same effects as those of the seventh exemplary embodiment while reducing the circuit scale.

Ninth Exemplary Embodiment

Next, a ninth exemplary embodiment of the present invention will be described. The same signs will be given to portions that are the same as those in each of the preceding exemplary embodiments, and detailed description of those same portions will be omitted.

Figure 24:
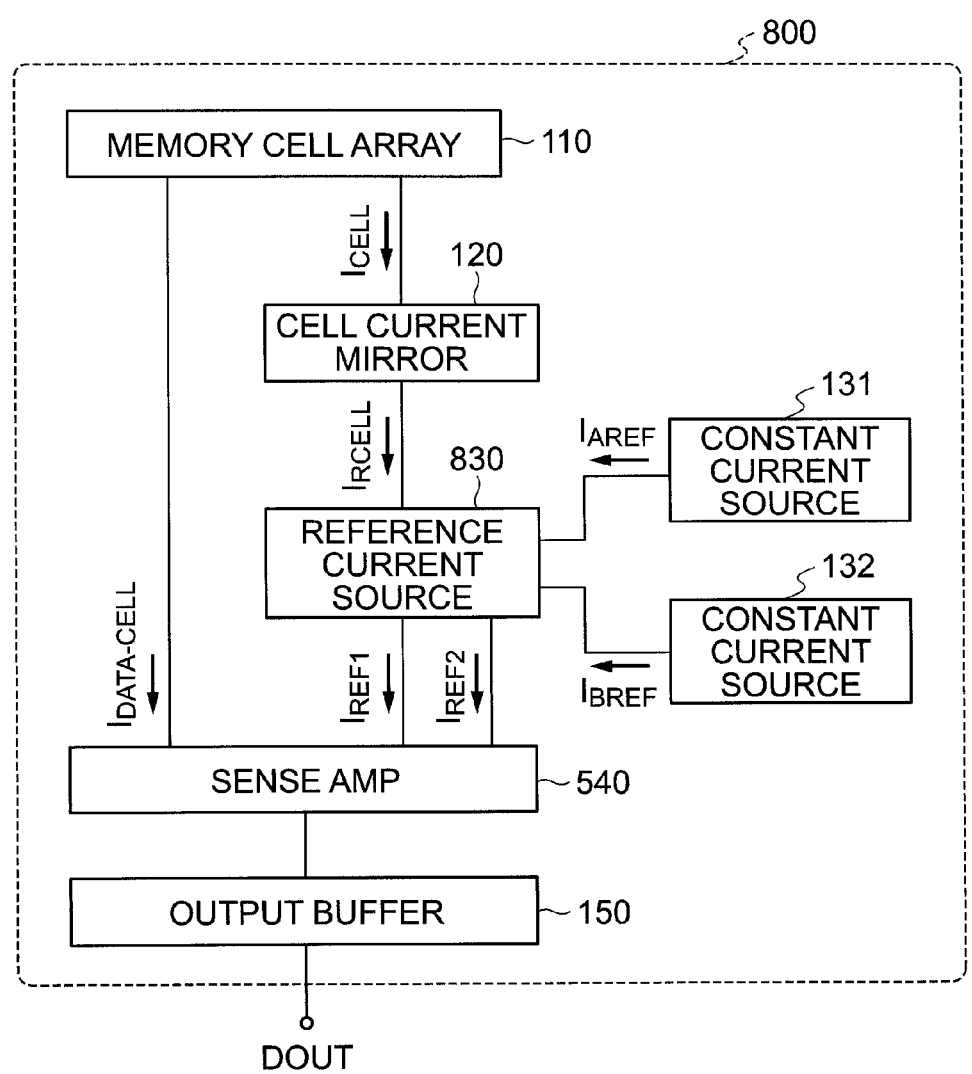
FIG. 24 is a block diagram of a readout circuit according to a ninth exemplary embodiment.

FIG. 24 is a block diagram showing the configuration of a readout circuit 800 according to the present exemplary embodiment. The readout circuit 800 is configured to include a memory cell array 110, a cell current mirror 120, a reference current source 830, constant current sources 131 and 132, a sense amp 540, and an output buffer 150. The memory cells configuring the memory cell array 110 are multiple-value memory cells.

Figure 25:
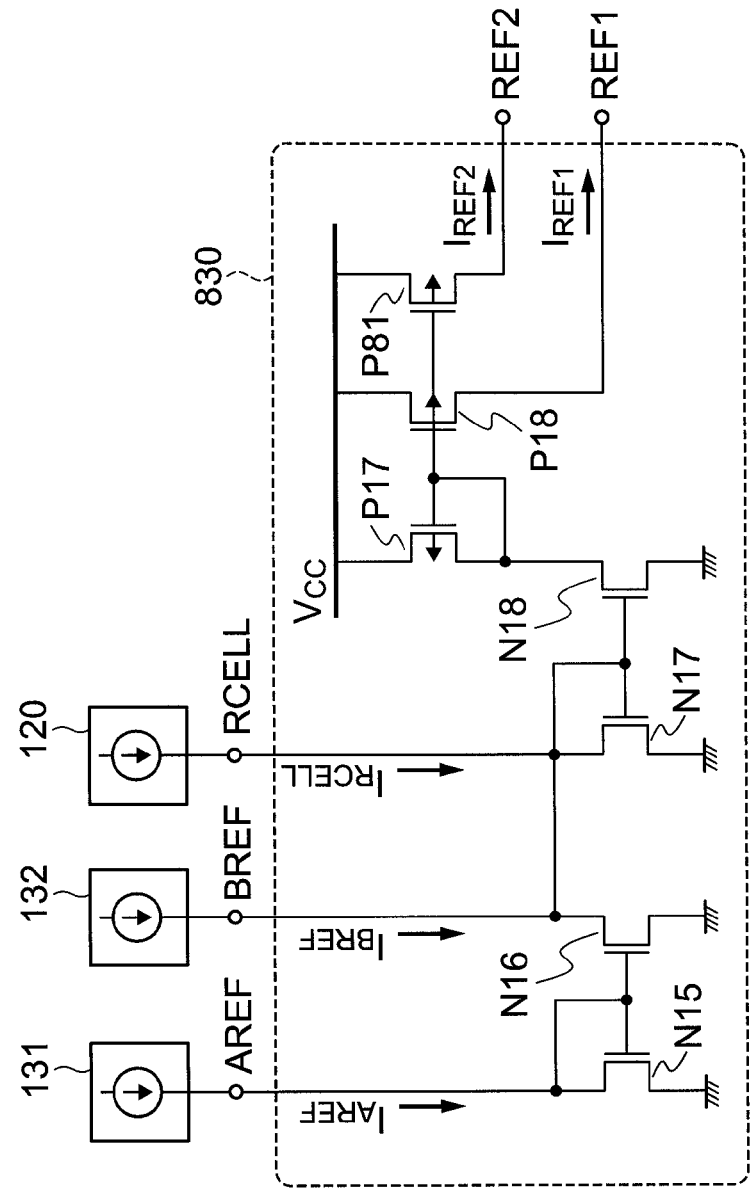
FIG. 25 is a circuit diagram of a reference current source according to the ninth exemplary embodiment.

FIG. 25 is a circuit diagram of the reference current source 830. The configuration of the circuit excluding P18 and P81

(reference current generating section) is the same as that of the reference current source 130 (see FIG. 2), so description will be omitted. The gate terminals of P18 and P81 are connected to the gate terminal of P17, and the source terminals of P18 and P81 are connected to a VCC power supply. Further, the drain terminal of P18 is connected to a REF1 terminal. The drain terminal of P81 is connected to a REF2 terminal. P17 and P18 form a current mirror circuit. P17 and P81 also form a current mirror circuit.

Here, ICELL denotes a memory cell current flowing from the memory cell array 110 into the BL terminal of the cell current mirror 120. IRCELL denotes a current flowing from the cell current mirror 120 via the RCELL terminal into the reference current source 830. IAREF and IBREF respectively denote currents flowing from the constant current sources 131 and 132 via the REF terminals into the AREF terminal and the BREF terminal of the reference current source 830. IREF1 and IREF2 respectively denote currents flowing from the reference current source 830 via the REF1 terminal and the REF2 terminal into the sense amp 540.

Next, the operation of the constant current source 830 will be described. The operation of the circuit excluding P18 and P81 is the same as that of the reference current source 130 (see FIG. 2), so description will be omitted. When IREF1 denotes a current flowing out from the REF1 terminal, becomes IREF1∝IBREF+IRCELL−IAREF because of the current mirror circuit formed by P17 and P18. Similarly, when IREF2 denotes a current flowing out from the REF2 terminal, becomes IREF2∝IBREF+IRCELL−IAREF.

The transistor size of P81 differs from the transistor size of P18. For that reason, IREF1 and IREF2 differ in their mirror ratios but are both mirror currents of IBREF+IRCELL−IAREF. In this case, the precision of IREF1 is higher than that of IREF2 which is generated by adding P81 of the different transistor size, so it is preferable to use, as the reference current, IREF1 whose precision is high where the current window is narrow.

Other circuit operations are the same as those of the readout circuit 600, so description will be omitted.

IRCELL flowing from the cell current mirror 120 into the reference current source 830 is proportional to the memory cell current of MC11. MC11 is used in the same condition as a memory cell that becomes a readout target. For this reason, characteristic fluctuation resulting from use conditions such as a bias voltage and temperature matches a readout target memory cell. Consequently, IRCELL represents a current value in which characteristic fluctuation of a readout target memory cell is reflected. ΔIRCELL denotes change in IRCELL accompanying this characteristic fluctuation.

The characteristics of the constant current sources 131 and 132 also fluctuate because of use conditions, such as a bias voltage and temperature. ΔIAREF and ΔIBREF respectively denote change in IAREF and IBREF accompanying this characteristic fluctuation. Readout target memory cells have different circuit configurations, so characteristic fluctuation does not match.

The current flowing out from the REF1 terminal of the reference current value 830 is IREF1∝IBREF+IRCELL−IAREF. Consequently, change resulting from characteristic fluctuation becomes ΔIREF1∝ΔIBREF+ΔIRCELL−ΔIAREF. Here, when IAREF and IBREF are set to current values that are about the same, ΔIAREF and ΔIBREF also become values that are about the same. Consequently, becomes ΔIBREF+ΔIRCELL−ΔIAREF≈ΔIRCELL.

IRCELL is a mirror current of a memory cell current, so it is distributed having variation to a certain extent because of the affect of memory cell characteristic variation. ΔIMC denotes deviation from a target value of IRCELL resulting from this variation. When IBREF and IAREF are adjusted by a trimming circuit or the like in order to cancel out ΔIMC, becomes IBREF−IAREF=−ΔIMC.

From the above, in consideration of characteristic fluctuation and memory cell characteristic variation, the current flowing out from the REF1 terminal of the reference current source 830 becomes IREF1∝IBREF+IRCELL−IAREF+ΔIBREF+ΔIRCELL−ΔIAREF+ΔIMC. Here, ΔIBREF+ΔIRCELL−ΔIAREF≈ΔIRCELL and IBREF−IAREF=−ΔIMC, so IREF1∝IRCELL+ΔIRCELL. Similarly, becomes IREF2∝IRCELL+ΔIRCELL. Namely, the ninth exemplary embodiment can realize the same effects as those of the eighth exemplary embodiment while reducing the circuit scale because of IREF1 and IREF2 of the reference current source 830.

The readout circuits described in the first to ninth exemplary embodiments are suited for a nonvolatile semiconductor storage device such as, for example, a read-only memory (ROM). However, the present invention is not limited to a ROM and is also applicable to a flash ROM.

Further, the readout circuits described in the sixth to ninth exemplary embodiments are circuits where the readout circuits described in the first and second exemplary embodiments are applied toward multiple-value memory cells.

Further, the readout circuits described in the third to fifth exemplary embodiments also can be similarly applied toward multiple-value memory cells.

What is claimed is:

1. A nonvolatile semiconductor storage device comprising:
a readout target memory cell that is a data readout target;
a reference memory cell having the same configuration as the readout target memory cell;
a constant current source that includes a first constant current source and a second constant current source, which have the same characteristics; and
a reference current source that generates, as a reference current for determining the logic level of the readout target memory cell, a current obtained by adding one constant current, out of a first constant current flowing through the first constant current source or a second constant current flowing through the second constant current source, with a reference memory cell current flowing in the reference memory cell, and by subtracting the other constant current, out of the first constant current or the second constant current, from the added current.

2. The nonvolatile semiconductor storage device according to claim 1, wherein the reference current source includes,
a first current mirror circuit connected with, a first MOS transistor through which the one constant current flows, and a second MOS transistor, through which the other constant current flows, that passes the same current as the current in through the first MOS transistor, and
a second current mirror circuit connected with, a third MOS transistor through which the reference memory cell current flows, and a fourth MOS transistor that passes the same current as the current flowing in the third MOS transistor,
wherein at least one of the third MOS transistor and the fourth MOS transistor is connected to the second MOS transistor.

3. The nonvolatile semiconductor storage device according to claim 1, wherein the nonvolatile semiconductor storage device includes a plurality of the reference memory cells having the same configuration, and the reference memory cell current is a current obtained by averaging a plurality of reference memory cell currents flowing through the plurality of the reference memory cells.

4. The nonvolatile semiconductor storage device according to claim 1, wherein the nonvolatile semiconductor storage device includes,
- a plurality of the reference memory cells through which plural types of the reference memory cell currents respectively flow,
- a plurality of the constant current sources through which plural types of the two constant currents respectively flow, and
- a plurality of the reference current sources that generate plural types of the reference currents.

5. The nonvolatile semiconductor storage device according to claim 1, wherein the nonvolatile semiconductor storage device includes,
- a plurality of the constant current sources through which plural types of the two constant currents respectively flow,
- a plurality of the reference current sources that generate plural types of the reference currents, and
- a cell current mirror circuit, disposed between the plurality of the reference current sources and the reference memory cell, that generates plural types of reference memory cell currents from the reference memory cell current flowing through the reference memory cell.

6. The nonvolatile semiconductor storage device according to claim 5, wherein the first constant current source, included in at least one constant current source of the plurality of the constant current sources, is also dually used as the first constant current source included in at least one constant current source of another, and the dually-used first constant current source includes, a constant current generating section that generates plural types of the first constant current.

7. The nonvolatile semiconductor storage device according to claim 1, wherein the reference current source includes a reference current generating section that generates a different reference current from the reference current that has been generated.

8. The nonvolatile semiconductor storage device according to claim 1, further comprising:
- a comparing section that outputs a result of comparison between a memory cell current of the readout target memory cell, and the reference current that has been generated by the reference current source.

* * * * *